(12) United States Patent
Chung et al.

(10) Patent No.: US 8,350,158 B2
(45) Date of Patent: Jan. 8, 2013

(54) TAPE WIRING SUBSTRATES AND PACKAGES INCLUDING THE SAME

(75) Inventors: Yechung Chung, Hwasung-si (KR); Chulwoo Kim, Cheonan-si (KR); Eunseok Song, Hwasung-si (KR); Kyoungsei Choi, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 365 days.

(21) Appl. No.: 12/507,551

(22) Filed: Jul. 22, 2009

(65) Prior Publication Data

US 2010/0038117 A1    Feb. 18, 2010

(30) Foreign Application Priority Data

Aug. 18, 2008 (KR) .................. 10-2008-0080559

(51) Int. Cl.
*H05K 1/00* (2006.01)

(52) U.S. Cl. ........ 174/254; 174/250; 174/260; 174/261; 361/749; 361/750; 361/751

(58) Field of Classification Search .................. None
See application file for complete search history.

(56) References Cited

U.S. PATENT DOCUMENTS

| | | | | |
|---|---|---|---|---|
| 6,617,521 B1 * | 9/2003 | Saito et al. | ..................... | 174/260 |
| 6,642,611 B2 | 11/2003 | Iwasaki | | |
| 6,861,764 B2 * | 3/2005 | Sato et al. | ..................... | 257/797 |
| 7,061,125 B2 * | 6/2006 | Cho et al. | ..................... | 257/790 |
| 7,253,503 B1 * | 8/2007 | Fusaro et al. | ................. | 257/668 |
| 7,329,597 B2 | 2/2008 | Chung et al. | | |
| 7,368,821 B2 * | 5/2008 | Kim et al. | ..................... | 257/738 |
| 7,420,270 B2 | 9/2008 | Lee et al. | | |
| 7,476,975 B2 * | 1/2009 | Ogata | ........................... | 257/778 |
| 7,554,201 B2 * | 6/2009 | Kang et al. | ..................... | 257/772 |

(Continued)

FOREIGN PATENT DOCUMENTS

JP       07-094555       4/1995

(Continued)

OTHER PUBLICATIONS

Office Action dated Oct. 17, 2008 for counterpart Chinese Application No. 2006100678640.

(Continued)

*Primary Examiner* — Boris Chervinsky
(74) *Attorney, Agent, or Firm* — Harness, Dickey & Pierce, P.L.C.

(57) ABSTRACT

Example embodiments are directed to a tape wiring substrate including a film having an upper surface including a chip mounting area, the chip mounting area further including an inner area and a peripheral area, the film further including a lower surface, and vias penetrating the film, the vias being located in the inner area, an upper metal layer on the upper surface of the film and connected to electrode bumps of a semiconductor chip, and a lower metal layer on the lower surface of the film. Example embodiments are directed to a tape wiring substrate including a film having an upper surface including a chip mounting area, a lower surface, and vias penetrating the film, an upper metal layer on the upper surface of the film and connected to electrode bumps of a semiconductor chip, and a lower metal layer on the lower surface of the film, the vias being located outside of the chip mounting area. Example embodiments are directed to packages including tape wiring substrates.

13 Claims, 25 Drawing Sheets

U.S. PATENT DOCUMENTS

| | | | |
|---|---|---|---|
| 7,589,421 B2 * | 9/2009 | Cho et al. | 257/734 |
| 7,599,193 B2 * | 10/2009 | Park et al. | 361/783 |
| 7,659,607 B2 * | 2/2010 | Iwasaki | 257/679 |
| 2003/0058230 A1 | 3/2003 | Ide | |
| 2004/0145052 A1 | 7/2004 | Ueno et al. | |
| 2005/0023147 A1 | 2/2005 | Hashimoto | |
| 2005/0093114 A1 | 5/2005 | Son et al. | |
| 2005/0218512 A1 | 10/2005 | Egawa et al. | |
| 2007/0013056 A1 | 1/2007 | Lee et al. | |
| 2007/0018312 A1 * | 1/2007 | Jo | 257/720 |
| 2007/0094872 A1 | 5/2007 | Konishi et al. | |
| 2008/0315437 A1 | 12/2008 | Lee et al. | |

FOREIGN PATENT DOCUMENTS

| | | |
|---|---|---|
| JP | 2001-102406 | 4/2001 |
| KR | 10-2003-0037168 | 5/2003 |

OTHER PUBLICATIONS

Second Office Action dated May 8, 2009 for counterpart Chinese Application No. 2006100678640 and English translation thereof.

* cited by examiner

TAPE WIRING SUBSTRATES AND PACKAGES INCLUDING THE SAME

PRIORITY STATEMENT

This application claims priority under 35 U.S.C. §119 to Korean Patent Application No. 10-2008-0080559 filed on Aug. 18, 2008, the contents of which are herein incorporated by reference in their entirety for all purposes.

BACKGROUND

1. Field

Example embodiments are directed to tape wiring substrates and packages including the same.

2. Description of the Related Art

Flat panel displays may include, for example, a liquid crystal display ("LCD") for portable phones, a thin-film transistor liquid crystal display ("TFT LCD") for computers and plasma display panels ("PDP") for domestic use. A flat panel display may include a component part known in the art as a tape package. In some applications, the tape package may have fine pitch wiring patterns.

Tape packages may include a tape wiring substrate. The two principal types of tape packages may be a tape carrier package ("TCP") and a chip on film ("COF") package. The tape wiring substrate of a TCP may have a chip mounting window in which a semiconductor chip may be mounted via an inner lead bonding method (for example). The tape wiring substrate of a COF package may not include a chip mounting window.

The semiconductor chip may be flip chip bonded to the tape wiring substrate. As compared to the TCPs, the COF packages may allow a thinner tape wiring substrate and/or finer pitch wiring patterns.

In the COF packages, I/O terminal patterns may act as external connection terminals, instead of solder bumps. The I/O terminal patterns may be directly attached to a printed circuit board or a display panel.

FIG. 1 is a plan view of a conventional COF package 1100. FIG. 2 is a cross-sectional view taken along the line II-II of FIG. 1.

Referring to FIGS. 1 and 2, the COF package 1100 may include a tape wiring substrate 1120. A semiconductor chip 1110 may be flip chip bonded to the tape wiring substrate 1120. A molding compound 1140 may seal the flip chip bonded portion through an underfill process.

The semiconductor chip 1110 may have an active surface that may support electrode pads 1112. The electrode pads 1112 may be provided along the edge portions of the active surface. Electrode bumps 1116 may be provided on the electrode pads 1112. The electrode bumps 1116 may include input bumps 1117 and output bumps 1118, for example. The input bumps 1117 may include ground bumps 1117a and power bumps 1117b, for example.

The tape wiring substrate 1120 may include a base film 1121, and an upper metal layer 1124 provided on the upper surface 1122 of the base film 1121. The base film 1121 may have a chip mounting area confronting the semiconductor chip 1110. The chip mounting area may be located in the center portion of the base film 1121. The base film 1121 may include sprocket holes 1129. The sprocket holes 1129 may be arranged along the base film 1121 at predetermined or desired intervals. An end of the upper metal layer 1124 may be connected to the electrode bumps 1116. Another end of the upper metal layer 1124 may extend outwards from the chip mounting area. The upper metal layer 1124 may include input terminal patterns 1125 and output terminal patterns 1126. The input terminal patterns 1125 may include input terminal patterns for ground 1125a ("ground terminal patterns") and input terminal patterns for power 25b ("power terminal patterns"). The input terminal patterns 1125 may extend to one side of the base film 1121 relative to the semiconductor chip 1110, and the output terminal patterns 1126 may extend to another side of the base film 1121 relative to the semiconductor chip 1110. The input and the output terminal patterns 1125 and 1126 may extend parallel to the arrangement of the sprocket holes 1129.

When the semiconductor chip 1110 is flip chip bonded to the tape wiring substrate 1120, the ground bumps 1117a may be bonded to the ground terminal patterns 1125a and the power bumps 1117b may be bonded to the power terminal patterns 1125b.

Although conventional COF packages are generally thought to be acceptable, they are not without shortcomings. For example, to facilitate achievement of semiconductor products having lighter weight, smaller size, higher speed, multifunction and/or increased performance, the upper metal layer 1124 may have fine pitch wiring patterns, the semiconductor chip 1110 may be more miniaturized, and the number of electrode bumps 1116 may be increased. Accordingly, the ground terminal patterns 1125a and the power terminal patterns 1125b may be reduced in pitch. The ground and the power terminal patterns 1125a and 1125b provided on the upper surface 1122 of the base film 1121 may have insufficient areas for stable ground and/or power supply, for example.

The conventional COF package 1100 may insufficiently reduce electromagnetic waves and/or noise that may occur during operation of the semiconductor chip 1110, which may result in poor electromagnetic interference and/or noise characteristics. Further, the conventional COF package 1100 may unstably supply power to the semiconductor chip 1110.

FIG. 3 is a plan view of another conventional COF package 1200. FIG. 4 is a cross-sectional view taken along the line IV-IV of FIG. 3. FIG. 5A is a bottom view of the conventional COF package 1200. FIG. 5B is a bottom view of another conventional COF package 1300.

Referring to FIGS. 3 through 5B, the COF package 1200 may include a tape wiring substrate 1120 and semiconductor chip 1110. The tape wiring substrate 1120 may have a dual metal layer 1124 and 1131. The semiconductor chip 1110 may be flip chip bonded to the tape wiring substrate 1120. A molding compound 1140 may seal the flip chip bonded portion. The molding compound may be provided via an underfill process, for example.

The semiconductor chip 1110 may have an active surface with electrode pads 1112. The electrode pads 1112 may be provided along the periphery of the active surface. Electrode bumps 1116 may be provided on the electrode pads 1112. The electrode bumps 1116 may include input bumps 1117 and output bumps 1118, for example. The input bumps 1117 may include ground bumps 1117a and power bumps (not shown), for example. The input bumps 1117 may be larger in size and/or pitch than the output bumps 1118. This may reduce fault likelihood which may occur (for example) due to static electricity between the input bumps 1117. The semiconductor chip 1110 may include dummy bumps 1119. The dummy bumps 1119 may be provided at the corner regions of the active surface, for example. The dummy bumps 1119 may improve assembly stability and/or heat radiation, for example.

The tape wiring substrate 1120 may include a base film 1121. The base film 1121 may be fabricated from polyimide, for example. The base film 1121 may be fabricated from numerous other materials that are well known in this art. The dual metal layer 124 and 1131 may be fabricated from Cu foiled on the base film 1121, for example. The dual metal layers 1124 and 1131 may be fabricated from numerous materials (other than Cu) and using numerous techniques (other than foiling) that are well known in this art. The base film 1121 may have an upper surface 1122 including a chip mounting area, and a lower surface 1123 opposite to the upper surface 1122. The chip mounting area may be that portion of the upper surface 1122 that may confront the semiconductor chip 1110. That is, the semiconductor chip 1110 may be superposed above the chip mounting area of the upper surface 1122. Vias 1127 may penetrate the base film 1121. The dual metal layer 124 and 1131 may include an upper metal layer 1124 provided on the upper surface 122 of the base film 1121, and a lower metal layer 1131 provided on the lower surface 123 of the base film 1121.

The upper metal layer 1124 may be provided on the chip mounting area and may be connected to the electrode bumps 1116. The upper metal layer 1124 may extend outwards from the chip mounting area. The upper metal layer 1124 may include input terminal patterns 1125 and output terminal patterns 1126, for example. By way of example only, the input terminal patterns 1125 may extend to one side of the base film 1121 relative to the semiconductor chip 1110, and the output terminal patterns 1126 may extend to another side of the base film 1121 relative to the semiconductor chip 1110. The input terminal patterns 1125 may include ground terminal patterns 1125a connected to the ground bumps 1117a.

The lower metal layer 1131 may be provided on a region of the lower surface 1123 corresponding to the chip mounting area. For example, the chip mounting area may be superposed above the lower metal layer 1131. The lower metal layer 1131 may include a ground layer 1132. The ground layer 1132 may be connected to the ground terminal patterns 1125a through the vias 1127. By way of example only, the ground layer 1132 may cover at least the chip mounting area. The ground layer 1132 may be fabricated from a plate or a mesh, for example. The ground layer 1132 may provide a sufficient ground area to reduce the dissipation of electromagnetic waves and/or noise that the semiconductor chip 1110 may emit, thereby improving the electrical stability.

The vias 1127 connecting the ground terminal patterns 1125a to the ground layer 1132 may reduce the need for separate wirings for connecting the ground terminal patterns 125a to the ground layer 1132, and/or reduce the ground route length.

The upper metal layer 1124 may be arranged on an outer peripheral region of the chip mounting area. The upper metal layer 1124 may not cover a central portion of the chip mounting area. The arrangement of the upper metal layer 1124 only on the peripheral region of the chip mounting area (and not on the central portion of the chip mounting area) may facilitate the flow of the molding compound 1140 during an underfill process and/or decrease the likelihood of void generation.

The ground layer 1132 may serve as a heat sink for radiating the heat which the semiconductor chip 1110 may emit, for example. The dummy bumps 1119 may be connected to the ground layer 1132 to improve heat radiation characteristics, for example. The dummy bumps 1119 may be connected to dummy terminal patterns 1128 through dummy vias 1134.

The ground layer 1132 may be of an integral, one-piece construction or the ground layer may be of a multi-piece construction. For example, referring to FIG. 5B, a COF package 1300 may include a tape wiring substrate 220 having a first ground layer 1232a and a second ground layer 1232b. First ground bumps 1217a' may be connected to the first ground layer 1232a through first vias 1227a. Second ground bumps 1217a'' may be connected to the second ground layer 232b through second vias 1227a''.

The multi-piece ground layer 1232 may be implemented when different voltages may be applied to a semiconductor chip 1210. For example, when the semiconductor chip 1210 has an analog circuit having an applied voltage of 5V and a digital circuit having an applied voltage of 1.5V, the ground layer may be separated into a ground layer for the analog circuit and a ground layer for the digital circuit.

The base film may have the ground layer only or the base film may have a ground layer and a power layer.

SUMMARY

Example embodiments are directed to a tape wiring substrate including a film having an upper surface including a chip mounting area, the chip mounting area further including an inner area and a peripheral area, the film further including a lower surface, and vias penetrating the film, the vias being located in the inner area, an upper metal layer on the upper surface of the film and connected to electrode bumps of a semiconductor chip, and a lower metal layer on the lower surface of the film.

Example embodiments are directed to a package including a semiconductor chip having an active surface with electrode bumps, a tape wiring substrate on which the semiconductor chip is mounted such that the electrode bumps face the tape wiring substrate, and a molding compound provides between the semiconductor chip and the tape wiring substrate, the tape wiring substrate further including a film having an upper surface including a chip mounting area, the chip mounting area further including an inner area and a peripheral area, the film further including a lower surface, and vias penetrating the film, the vias being located in the inner area, an upper metal layer on the upper surface of the film and connected to electrode bumps of a semiconductor chip, and a lower metal layer on the lower surface of the film.

Example embodiments are directed to a tape wiring substrate including a film having an upper surface including a chip mounting area, a lower surface, and vias penetrating the film, an upper metal layer on the upper surface of the film and connected to electrode bumps of a semiconductor chip, and a lower metal layer on the lower surface of the film, the vias being located outside of the chip mounting area.

Example embodiments are directed to a package including a semiconductor chip having an active surface with electrode bumps, a tape wiring substrate on which the semiconductor chip is mounted such that the electrode bumps face the tape wiring substrate, and a molding compound provides between the semiconductor chip and the tape wiring substrate, the tape wiring substrate further including a film having an upper surface including a chip mounting area, a lower surface, and vias penetrating the film, an upper metal layer on the upper surface of the film and connected to electrode bumps of a semiconductor chip, and a lower metal layer on the lower surface of the film, the vias being located outside of the chip mounting area.

BRIEF DESCRIPTION OF THE DRAWINGS

The above and other features and advantages of example embodiments will become more apparent by describing them in detailed with reference to the accompanying drawings.

DETAILED DESCRIPTION

Figure 1:
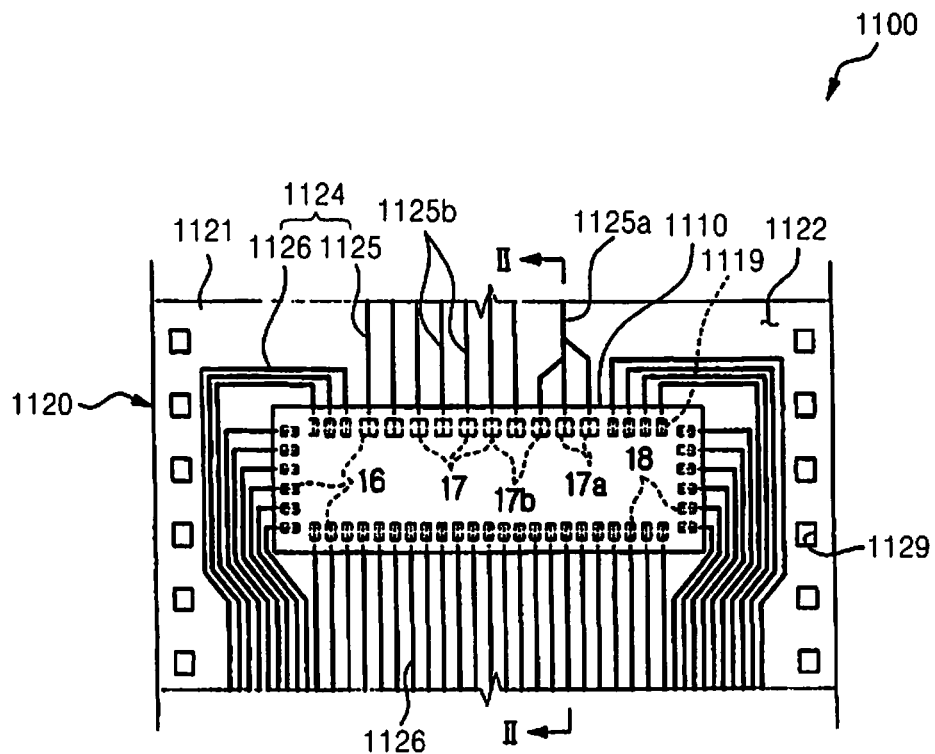
FIG. 1 is a plan view of a conventional COF package.
Figure 2:
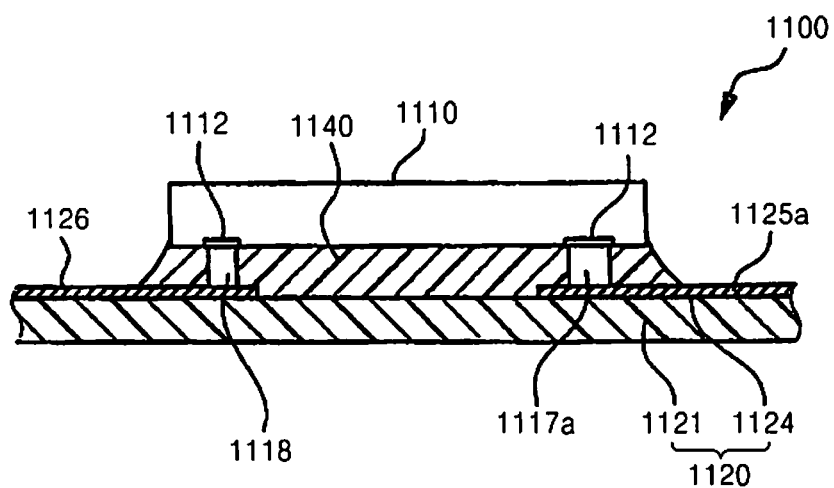
FIG. 2 is a cross-sectional view taken along the line II-II of FIG. 1.
Figure 3:
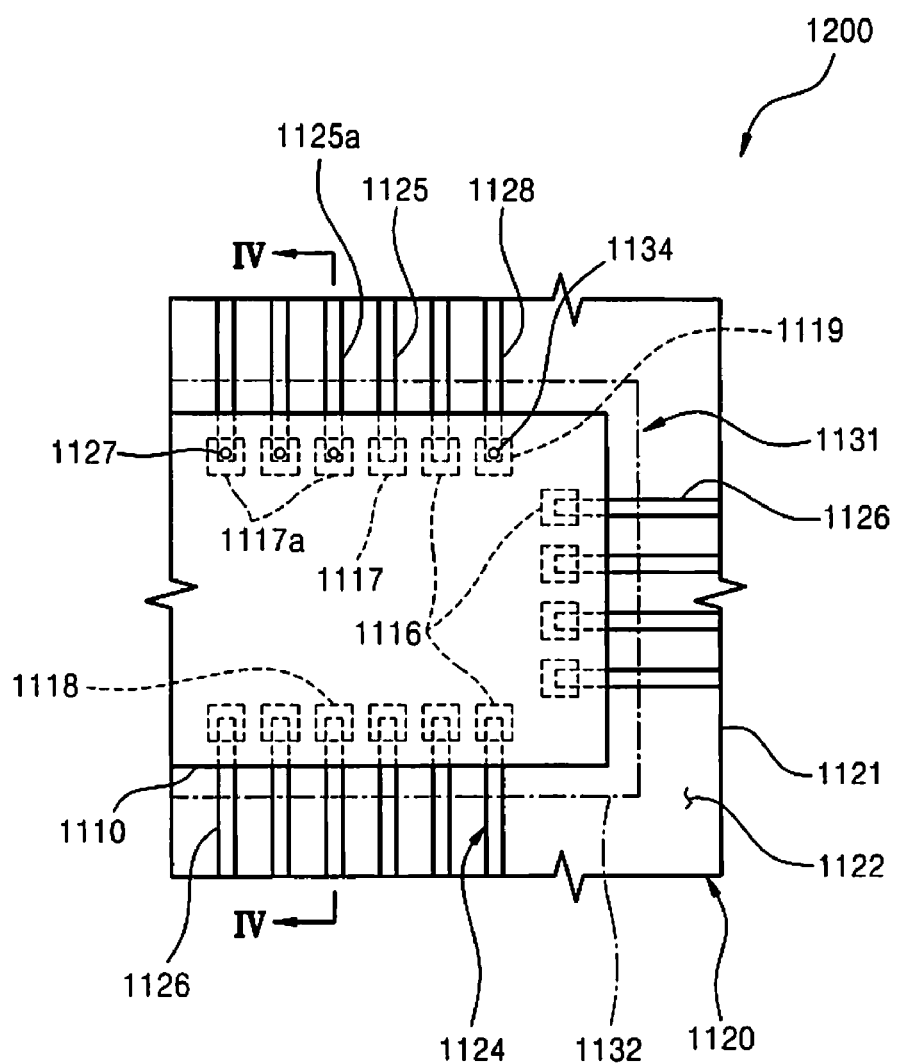
FIG. 3 is a plan view of another conventional COF package.
Figure 4:
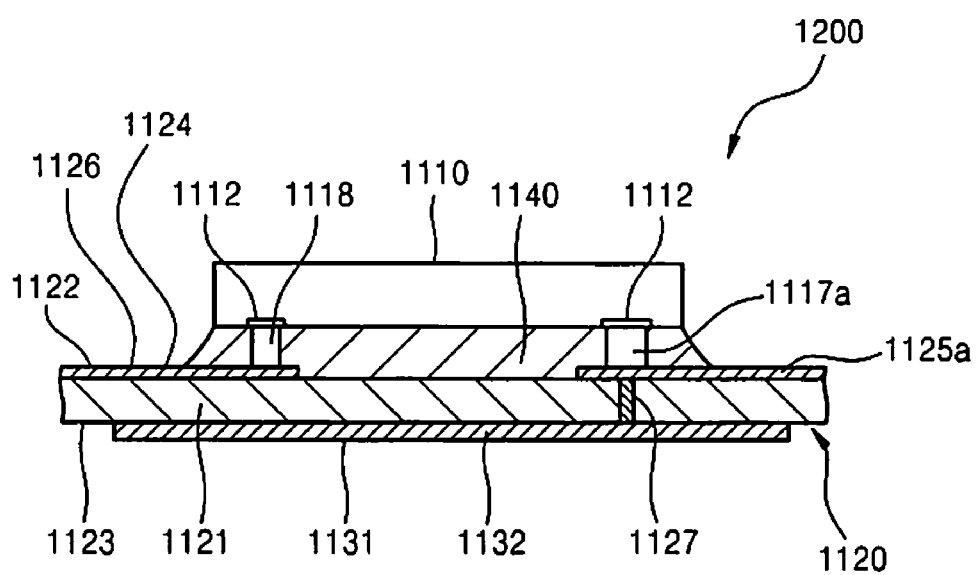
FIG. 4 is a cross-sectional view taken along the line IV-IV of FIG. 3.
Figure 5A:
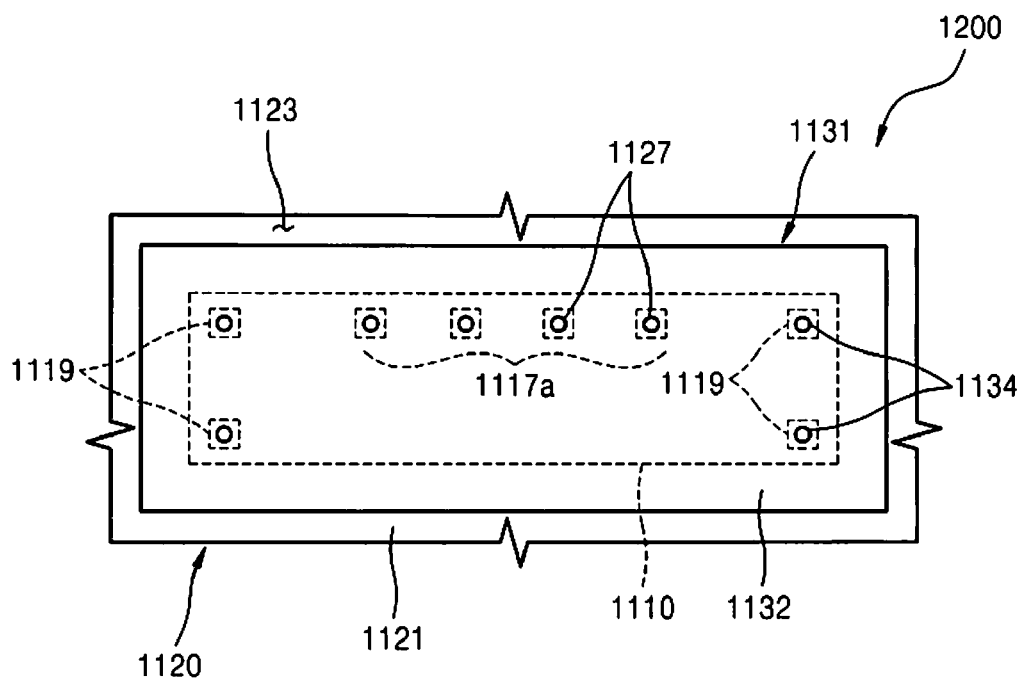
FIG. 5A is a bottom view of the conventional COF package of FIG. 3.
Figure 5B:
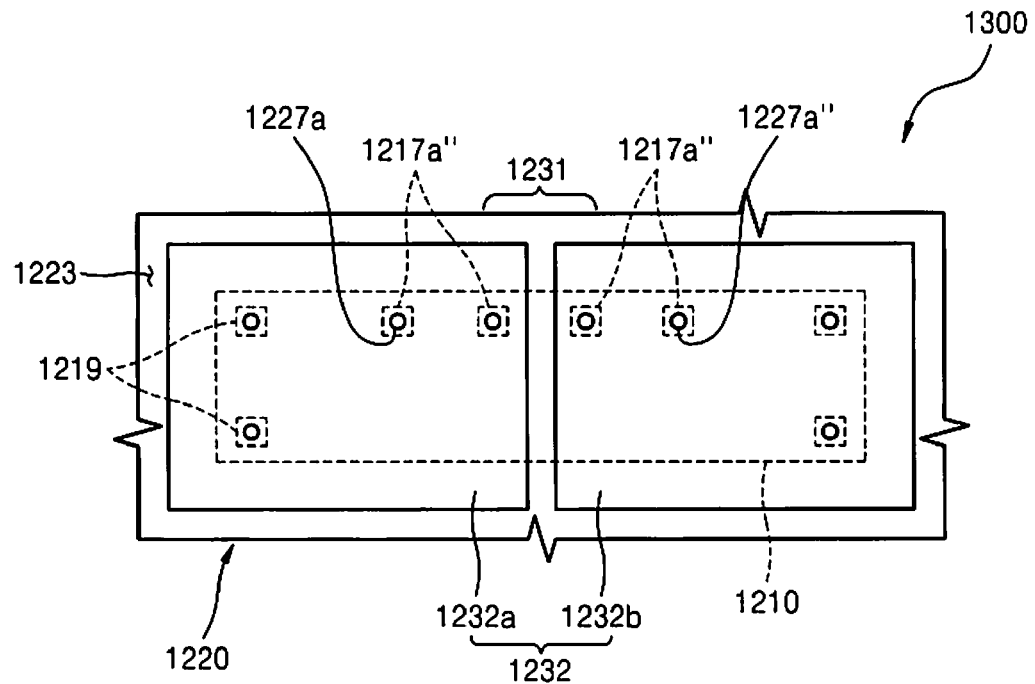
FIG. 5B is a bottom view of another conventional COF package.

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the FIGS.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout. Example embodiments should not be construed as limited to the particular shapes of regions illustrated in these FIGS. but are to include deviations in shapes that result, for example, from manufacturing.

Figure 6:
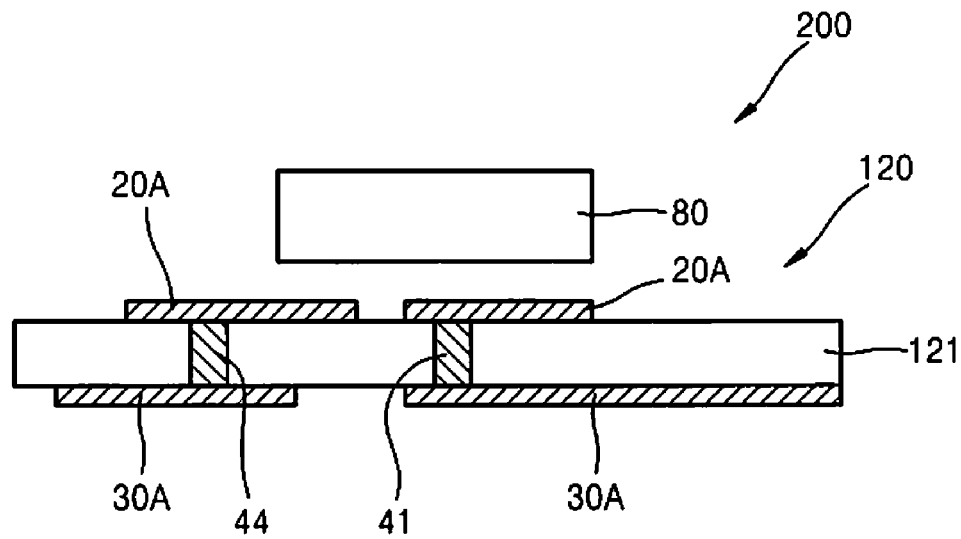
FIG. 6 illustrates a chip-on-film (COF) in accordance with example embodiments.

FIG. 6 illustrates a chip-on-film (COF) 200 in accordance with example embodiments. The COF 200 may include a film 120 further including a base film 121, a first metal layer 20A and/or a second metal layer 30A and one or more semiconductor chips 80. As shown in FIG. 6 the base film 121 may include one or more through vias 41, 44 usable to connect the first metal layer 20A to the second metal layer 30A. In example embodiments, the one or more through vias 44 do not overlap with the one or more semiconductor chips 80. For example, in example embodiments, the one or more through vias 44 are not under the one or more semiconductor chips 80. In example embodiments, the one or more through vias 44 may be outside one or more of the more semiconductor chips 80. In example embodiments, a thickness of second metal layer 30A is thicker than that of the first metal layer 20A.

In example embodiments, the one or more through vias 41 may be under a central portion of one or more of the one or more semiconductor chips 80.

In other example embodiments, one or more through vias (not shown) may be under a peripheral portion of one or more of the more semiconductor chips 80. In example embodiments, the one or more through vias may be in one or more of the above-described locations.

In example embodiments, the one or more through vias 41, 44 may be electrically connected to ground and/or power signals.

Figure 7:
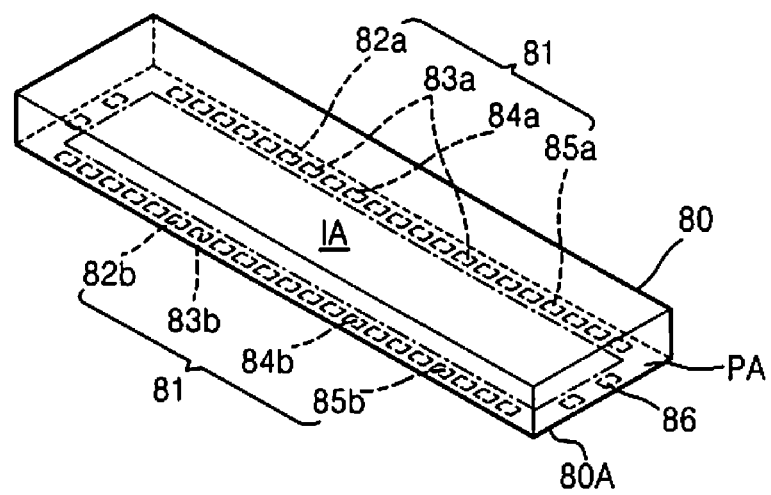
FIG. 7 illustrates an example chip of a COF in accordance with example embodiments.

FIG. 7 illustrates an example chip 80 of a COF in accordance with example embodiments. The chip 80 may include a first surface 80A, adjacent to the base film 121 (shown in FIG. 6) to which the chip 80 may be secured. The first surface 80A may be divided into an inner area IA and a peripheral area PA.

The chip 80 may include one or more plurality of pads 81 on one or more sides of the chip 80. A first plurality of pads 81a on a first edge of a first side of the chip 80 may include one or more ground pads 82a, 85a, one or more power pads 83a, and/or one or more signal pads 84a. A second plurality of pads 81b on a second edge of the first side of the chip 80 may include one or more ground pads 82b, 85b, one or more power pads 83b, and/or one or more signal pads 84b. One or more dummy pads 86 may also be provided on the chip 80.

In example embodiments, some or all of the one or more ground pads 82a, 85a, one or more power pads 83a, one or more signal pads 84a, one or more ground pads 82b, 85b, one or more power pads 83b, one or more signal pads 84b, and/or one or more dummy pads 86 are provided in the peripheral area PA.

In example embodiments, some or all of the one or more ground pads 82a, 85a are connected to ground patterns, one or more power pads 83a are connected to power patterns, one or more signal pads 84a are connected to signal patterns, and some or all of the one or more dummy pads 86 are unconnected or connected to heat sinks. These connections will be described in more detail below with reference to FIGS. 8 and 9.

Figure 8:
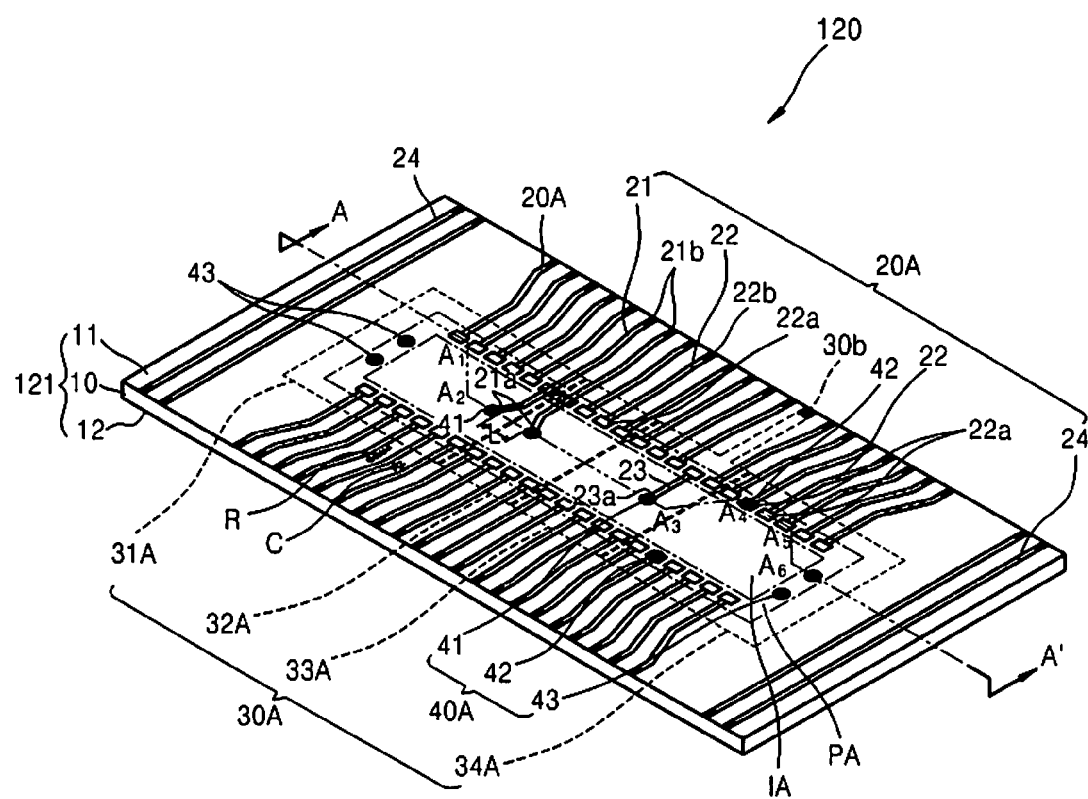
FIG. 8 illustrates an example film of a COF in accordance with example embodiments.
Figure 9:
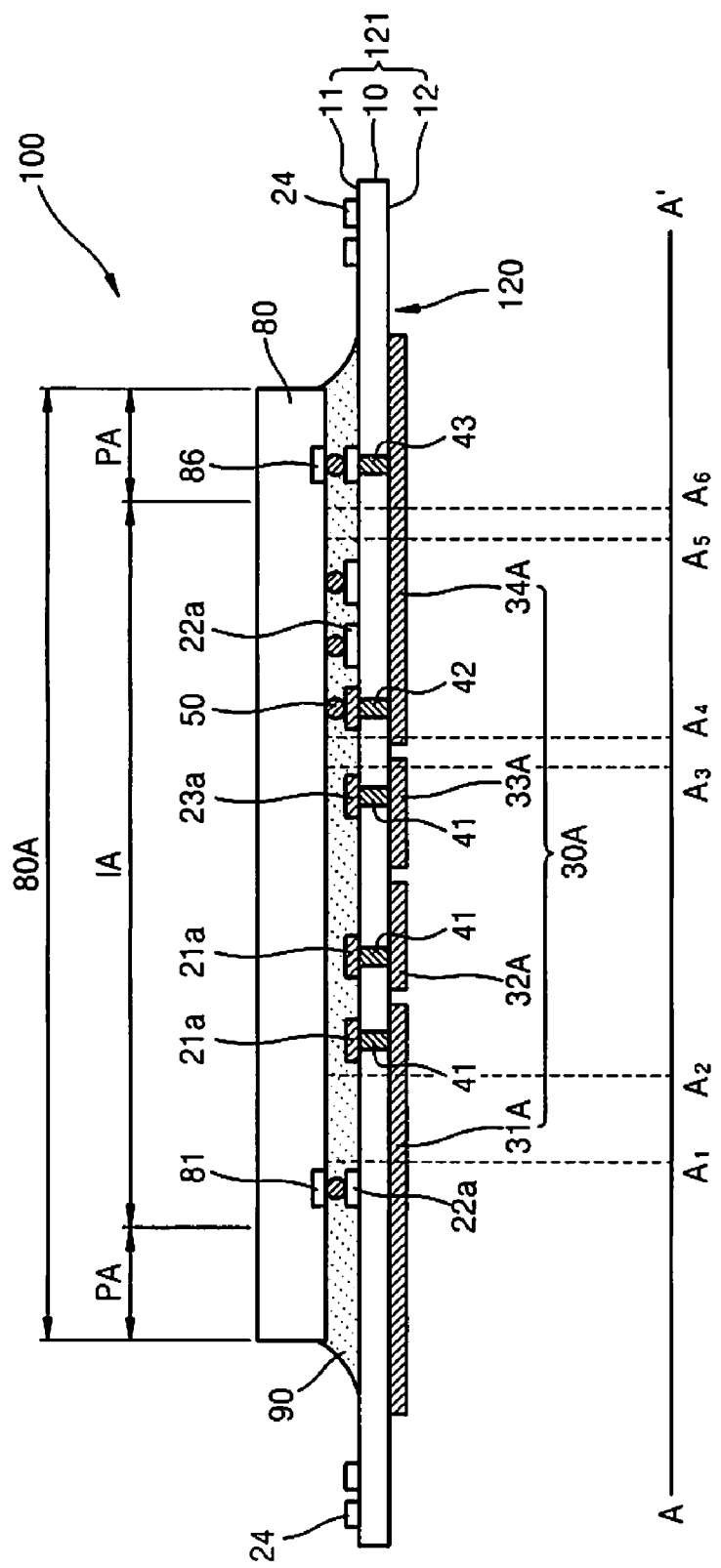
FIG. 9 illustrates an example cross-section of the example film of FIG. 8 along A-A'.

FIGS. 8 and 9 illustrate an example film 120 of a COF in accordance with example embodiments. Referring to FIGS. 8 and 9, the film 120 may include the base film 121 (for example, a film substrate 10) further including a first surface 11 and a second surface 12. The base film 121 may include a first conductive pattern 20A and a second conductive pattern 30A. The first conductive pattern 20A may include first interconnections 21, second interconnections 22, third interconnections 23, and/or fourth interconnections 24. Any or all of the first interconnections 21 may include end portions 21a, any or all of the second interconnections 22 may include end portions 22a, any or all of the third interconnections 23 may include end portions 23a, and/or any or all of the fourth interconnections 24 may include end portions 24a.

Any or all of the first interconnections 21 may include leads for external connection 21b, any or all of the second interconnections 22 may include leads for external connection 22b, any or all of the third interconnections 23 may include leads for external connection 23b, and/or any or all of the fourth interconnections 24 may include leads for external connection 24b.

As shown in FIG. 8, the second conductive pattern 30A may include a one or more ground patterns 31A, 34A, one or more power patterns 32A, and one or more redistribution patterns 33A. The base film 121 may have one or more vias 40A at various locations 41, 42, 43. In example embodiments, a distance L between vias 41 may be >25 um.

As shown in FIG. 8, the chip 80 may be placed on the film 120. As discussed above with reference to FIG. 7, the surface covered by the chip 80 may be divided into chip peripheral areas PA and an inner area IA.

The one or more vias 40A, 41, 42, 43 will be described in more detail with regard to FIG. 9 and locations A1-A6 along the axis A-A' in FIG. 8.

FIG. 9 illustrates a cross-section of example chip 80 of FIG. 7 and the example film 120 of FIG. 8 along A-A' of FIG. 8. As shown in FIG. 9, the chip 80 may be placed on the film 120. As discussed above with reference to FIG. 7, the surface 80A defined by the chip 80 may be divided into chip peripheral areas PA and an inner area IA. In example embodiments, a thickness of second metal layer 30A is thicker than that of the first metal layer 20A. In example embodiments, a thickness of second metal layer 30A is thicker than that of the first metal layer 20A, which may reduce resistance caused by pitch limitations of the interconnections 21, 22, 23, 24, and/or 25.

As shown in FIG. 9, the chip 80 may have active pads 81 and dummy pads 86. The active pads 81 and the dummy pads 86 may be connected to the first metal pattern 20A, for example, end patterns 22a by solders balls 50 (or conductive bumps). The first metal pattern 20A may be considered an upper metal pattern due to its orientation above the base film 121. The first metal pattern 20A may be connected to the second metal pattern 30A by vias 40A, 41, 42, 43. The second metal pattern 30A may be considered a lower metal pattern due to its orientation below the base film 121. In example embodiments, the second conductive pattern 30A may include a one or more patterns 31A, 32A, 33A, 34A, each of which may be one or more ground patterns, one or more power patterns, one or more signal patterns, one or more redistribution patterns, and one or more dummy patterns. In example embodiments, the interconnections 21, 22, 23, 24, and/or 25, the solders balls 50, and/or the vias 40A, 41, 42, 43 may overlap. For example, as shown in FIG. 9, the end portion 22a of interconnection 22, the solder ball 50, and the via 42 overlap.

In example embodiments, a first solder ball (or conductive bump) 50 connected to a via 41, 42, 43, 44 may be larger than a second solder ball (or conductive bump) 50 not connected to a via 41, 42, 43, 44. Input signals such as power or ground may be affected by noise. Also, wiring pattern resistance and EMI noise may also be problems. Example embodiments may solve one or all of these problems if the size of the first solder ball (or conductive bump) 50 connected to a via 41, 42, 43, 44 is as large as possible.

As shown in FIG. 9, the dummy pad 86 is connected to the pattern 34. As a result, the pattern 34 may be a ground pattern or a heat sink. As shown in FIG. 9, the patterns 31A and 34A may be ground patterns, the pattern 32A may be a power pattern, and the pattern 33A may be a redistribution pattern.

In example embodiments, the at least one chip 80 may be disposed on the film substrate 10. In example embodiments, the at least one chip 80 may be attached to the film substrate 10 by a tape automated bonding (TAB) method. In example embodiments, the at least one chip 80 may be surrounded by a molding material 90. In example embodiments, a portion of the first conductive pattern 20A and the second conductive pattern 30, 30A may be electrically connected through one or more vias 40A, 41, 42, 43.

In example embodiments, a portion of the first conductive pattern 20A and the second conductive pattern 30, 30A may be electrically connected through one or more vias 41, 42, in the chip inner area IA.

In example embodiments, the second conductive pattern 30A may be used for heat dissipation, for example, to reduce or prevent warpage of the COF. In example embodiments, ground and/or power signals may be transmitted via the second conductive pattern 30A, so that it is possible to increase the conductive area of the ground and/or power signals.

Figure 10:
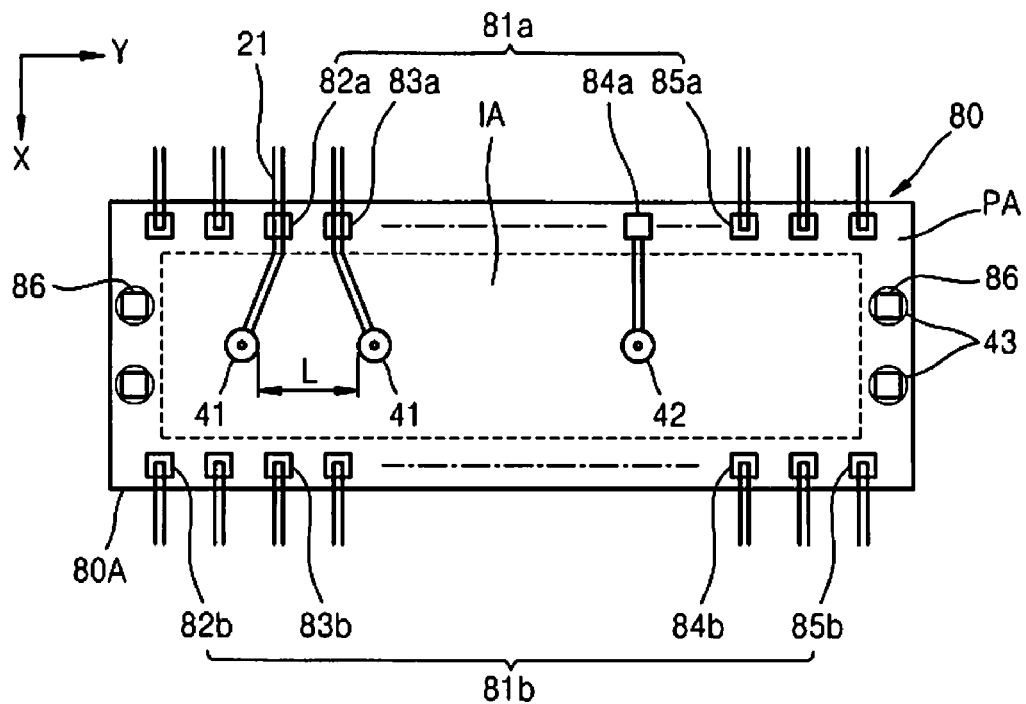
FIG. 10 illustrates a first surface of an example chip of a COF and connections to an example film of a COF in accordance with example embodiments.

FIG. 10 illustrates the first surface 80A of an example chip 80 of a COF and connections to an example film 120 of a COF in accordance with example embodiments.

The chip 80 may include one or more plurality of pads 81a and 81b on one or more sides of the chip 80. The first plurality of pads 81a on a first edge of a first side of the chip 80 may include one or more ground pads 82a, 85a, one or more power pads 83a, and/or one or more signal pads 84a. The second plurality of pads 81b on a second edge of the first side of the chip 80 may include one or more ground pads 82b, 85b, one or more power pads 83b, and/or one or more signal pads 84b. One or more dummy pads 86 may also be provided on the chip 80.

As shown in FIG. 10, the vias 41, 42 are in the inner area IA of the chip 80 and the vias 43 is in the peripheral areas PA. In example embodiments, the peripheral areas PA may be defined as the areas which contain the one or more plurality of pads 81a and 81b. In example embodiments, the inner area IA may be defined as the area which contains none of the one or more plurality of pads 81a and 81b.

As shown in FIG. 10, the peripheral areas PA surround the inner area IA. As shown in FIG. 10, the peripheral areas PA and the inner area IA may also be distinguished by the presence or absence of the one or more plurality of pads 81, although this need not be the case. For example, although the one or more plurality of pads 81 are in a straight line in the y-direction in FIG. 10, the one or more plurality of pads 81 may be staggered toward and/or away from the inner area IA along the x-direction and possibly be located within the inner area IA.

In example embodiments, the peripheral areas PA may be defined as the areas which contain the predominant numbers of the one or more plurality of pads 81. In example embodiments, the peripheral areas PA may be defined as the areas which contain the majority of the one or more plurality of pads 81a and 81b. In example embodiments, the peripheral areas PA may be defined as the areas which contain the predominant area of the one or more plurality of pads 81a and 81b. In example embodiments, the peripheral areas PA may be defined as the areas which contain the majority area of the one or more plurality of pads 81a and 81b.

In example embodiments, the inner area IA may be defined as the areas which contain a few of the one or more plurality of pads 81a and 81b. In example embodiments, the inner area IA may be defined as the areas which contain the minority of the one or more plurality of pads 81a and 81b. In example embodiments, the inner area IA may be defined as the area which contains a small area of the one or more plurality of pads 81a and 81b. In example embodiments, the inner area IA may be defined as the area which contains the minority area of the one or more plurality of pads 81a and 81b.

Similarly, although the vias 41, 42 are in a straight line in the y-direction in FIG. 10, the vias 41, 42 may be staggered toward and/or away from the peripheral areas PA along the x-direction and possibly be located within the peripheral areas PA.

Figure 11:
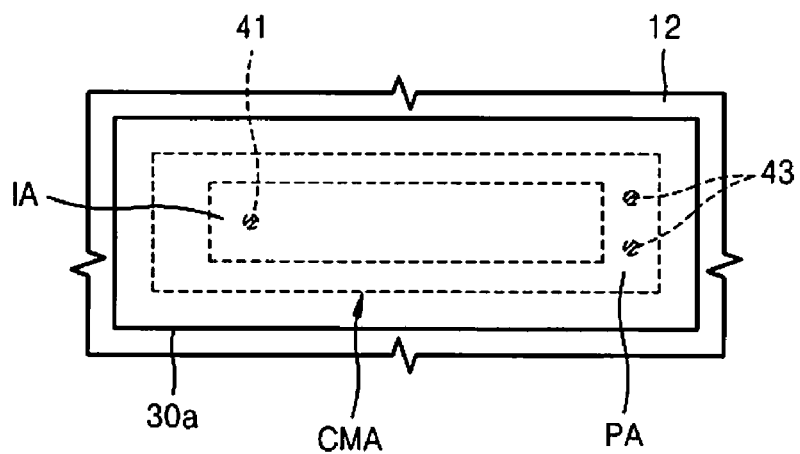
FIG. 11 illustrates a second conductive pattern in accordance with example embodiments.

FIG. 11 illustrates a second conductive pattern 30a in accordance with example embodiments. In example embodiments, the chip mounting area CMA may be larger than, smaller than or the same size as a surface of the chip 80. In example embodiments, the second conductive pattern 30a covers (fully or partially) the chip mounting area CMA. In example embodiments, the second conductive pattern 30a surrounds the chip mounting area CMA. In example embodiments, for example, FIG. 11, the second conductive pattern 30a fully covers and surrounds the chip mounting area CMA.

In example embodiments, the second conductive pattern 30a may be electrically connected to the first conductive pattern 20a through one or more vias 41, 43. Via 41 may be located in the inner area IA of the chip 80 while via 43 may be located in the peripheral area PA. In example embodiments, ground signals may be applied to the second conductive pattern 30a which may reduce electrical interference generated by the chip 80 and may be used as a heat sink. In example embodiments, the second conductive pattern 30a may only be connected to a dummy pad of the chip 80, and therefore, be used only as a heat sink.

In example embodiments, a higher operation voltage may be applied because the heat sink may reduce or prevent the COF from warping. Warpage may be generated by the CTE (Coefficients of Thermal Expansion) difference between the film substrate 10 and the molding material. Low operation voltage is applied to conventional devices to reduce the thermal stress.

In example embodiments, the vias 41 may reduce the need for separate wirings for connecting the first conductive pattern 20a to the second conductive pattern 30a, and/or reduce the ground route length.

In example embodiments, the second conductive pattern 30a may serve as a heat sink for radiating the heat which the semiconductor chip 80 may emit, for example. The dummy pads 86 may be connected to the second conductive pattern 30a to improve heat radiation characteristics, for example. The dummy pads 86 may be connected to dummy terminal patterns through dummy vias 43.

Figure 12:
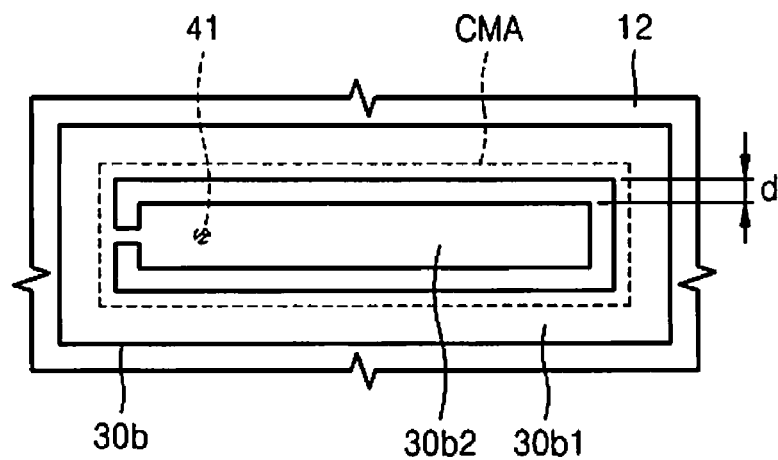
FIG. 12 illustrates a second conductive pattern in accordance with example embodiments.

FIG. 12 illustrates a second conductive pattern 30b in accordance with example embodiments. In example embodiments, the second conductive pattern 30b may have a clearance or gap d. In example embodiments, the second conductive pattern 30b includes at least two plates 30b1, 30b2 integrally formed or connected to each other. In example embodiments, such a configuration may be used to reduce thermal stress.

If the second conductive pattern 30b has a plate shape without the clearance or gap d, the second conductive pattern 30b may expand more during operation (generally, the time when thermal stress is generated) which may cause a warpage issue. Warpage may cause an "electrical open" problem between the semiconductor chip 80 and base film 121. Further, a designer who designs a COF package such as in example embodiments, may make a package shown in FIG. 17 and FIG. 18, because the COF packages (shown in FIG. 17 and FIG. 18) may have improved EMI characteristics and/or permit improved chip pad designs (chip pad locations).

Figure 13:
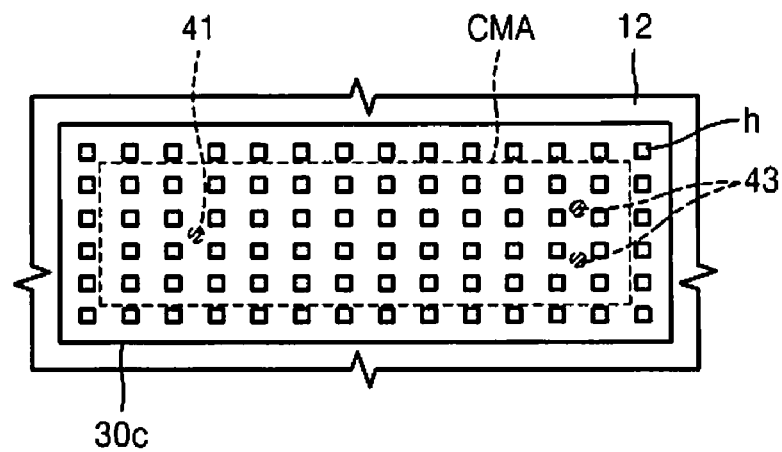
FIG. 13 illustrates a second conductive pattern in accordance with example embodiments.

FIG. 13 illustrates a second conductive pattern 30c in accordance with example embodiments. In example embodiments, the second conductive pattern 30c may have holes h. In example embodiments, the holes h may be of any number, shape, size, and/or pitch. In example embodiments, the second conductive pattern 30c may have a mesh shape or configuration including an array of holes h.

Figure 14:
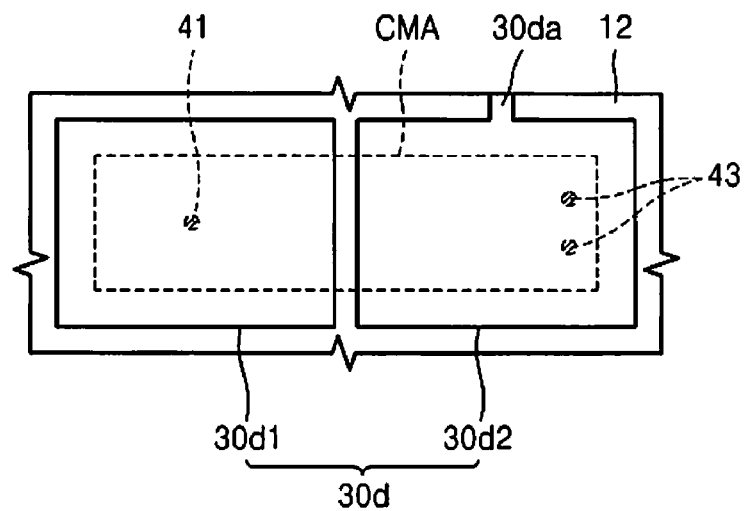
FIG. 14 illustrates a second conductive pattern in accordance with example embodiments.

FIG. 14 illustrates a second conductive pattern 30d in accordance with example embodiments. In example embodiments, the second conductive pattern 30d may be separated into at least two plates 30d1, 30d2. In example embodiments, the chip 80 may be a SOC system on-chip (SOC) having at least two circuits, for example, logic circuits, operation circuits and/or communication circuits. For example, one of the second conductive patterns 30d1 may be connected to a logic circuit and another second conductive pattern 30d2 may be connected to an operation circuit. In example embodiments, the same or different signals may be applied to the first plate 30d1 and the second plate 30d2. For example, ground signals may be applied to the first plate 30d1 and the second plate 30d2 or ground signals may be applied to the first plate 30d1 and power signals may be applied to the second plate 30d2. In example embodiments, one or more extended patterns 30da may optionally be formed on the second surface 12 of the base film 121 for external connection.

In example embodiments, the multi-piece second conductive pattern 30d may be implemented when different voltages may be applied to a semiconductor chip 80. For example, when the semiconductor chip 80 has an analog circuit having an applied voltage of 5V and a digital circuit having an applied voltage of 1.5V, the multi-piece second conductive pattern 30d may be separated into a second conductive pattern for the analog circuit and a second conductive pattern for the digital circuit.

In the above example embodiments, the multi-piece second conductive pattern 30d may have the ground layer only. In alternative embodiments, the base film may have a ground layer and a power layer.

Figure 15:
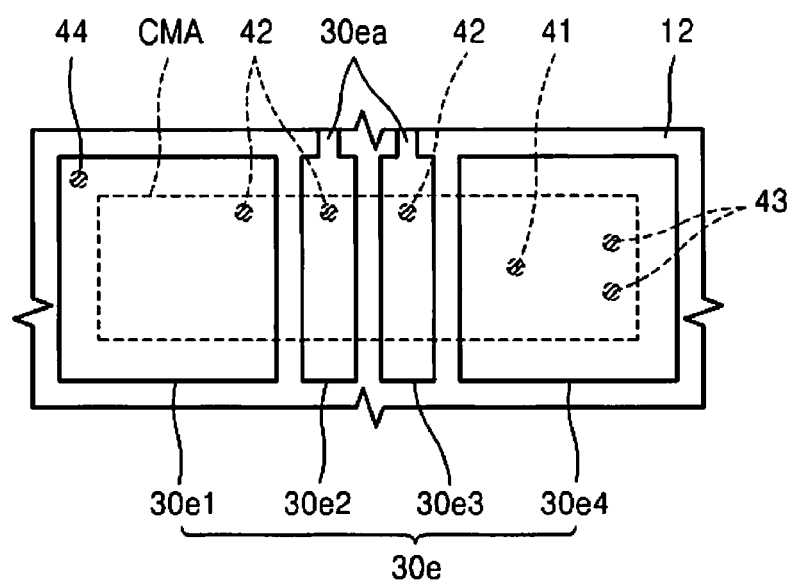
FIG. 15 illustrates a second conductive pattern in accordance with example embodiments.

FIG. 15 illustrates a second conductive pattern 30e in accordance with example embodiments. In example embodiments, the second conductive pattern 30e may be separated into at least two ground portions 30e1, 30e4 and at least two power portions 30e2, 30e3.

In example embodiments, the chip 80 may be a SOC system on-chip (SOC) having at least two circuits, for example, logic circuits, operation circuits and/or communication circuits. For example, one or more of the second conductive patterns 30e1, 30e2 may be connected to a logic circuit and one or more other second conductive patterns 30e3, 30e4 may be connected to an operation circuit. In example embodiments, ground signals may be applied to the ground portions 30e1, 30e4 and power signals may be applied to the power portions 30e2, 30e3. In example embodiments, one or more extended patterns 30ea may optionally be formed on the second surface 12 of the base film 121 for external connection.

In example embodiments, the second conductive pattern 30e including ground layers and power layers may have various layouts according to the arrangement and voltage of ground bumps and power bumps of a semiconductor chip.

Figure 16:
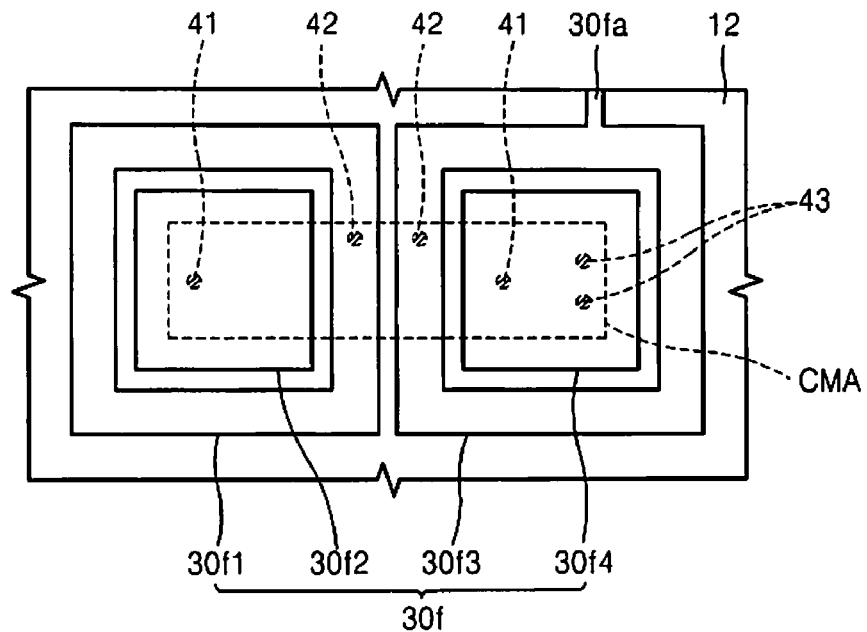
FIG. 16 illustrates a second conductive pattern in accordance with example embodiments.

FIG. 16 illustrates a second conductive pattern 30f in accordance with example embodiments. In example embodiments, the second conductive pattern 30f may be separated into at least two ground portions 30f1, 30f4 and at least two power portions 30f2, 30f3.

In example embodiments, the chip 80 may be a SOC system on-chip (SOC) having at least two circuits, for example, logic circuits, operation circuits and/or communication circuits. For example, one or more of the second conductive patterns 30f1, 30f2 may be connected to a logic circuit and one or more other second conductive patterns 30f3, 30f4 may be connected to an operation circuit. In example embodiments, ground signals may be applied to the ground portions 30f1, 30f4 and power signals may be applied to the power portions 30f2, 30f3. In example embodiments, one or more extended patterns 30fa may optionally be formed on the second surface 12 of the base film 121 for external connection.

In example embodiments shown in FIG. 16, each of the at least two ground portions 30f1, 30f4 completely surrounds at least two power portions 30f2, 30f3, respectively. In such example embodiments, EMI from the at least two power portions 30f2, 30f3 may be reduced.

In example embodiments, the power portions 30f2, 30f3 may have a ring shape enclosing the ground portions 30f1, 30f4. In example embodiments, the power portions 30f2, 30f3 may have a square ring shape. In alternative embodiments, the power portions 30f2, 30f3 may have an arcuate ring shape (e.g., a circular ring shape). Moreover, the spacing between the ground portions 30f1, 30f4 and the power portions 30f2, 30f3 may be uniform (as shown), or varied.

Figure 17:
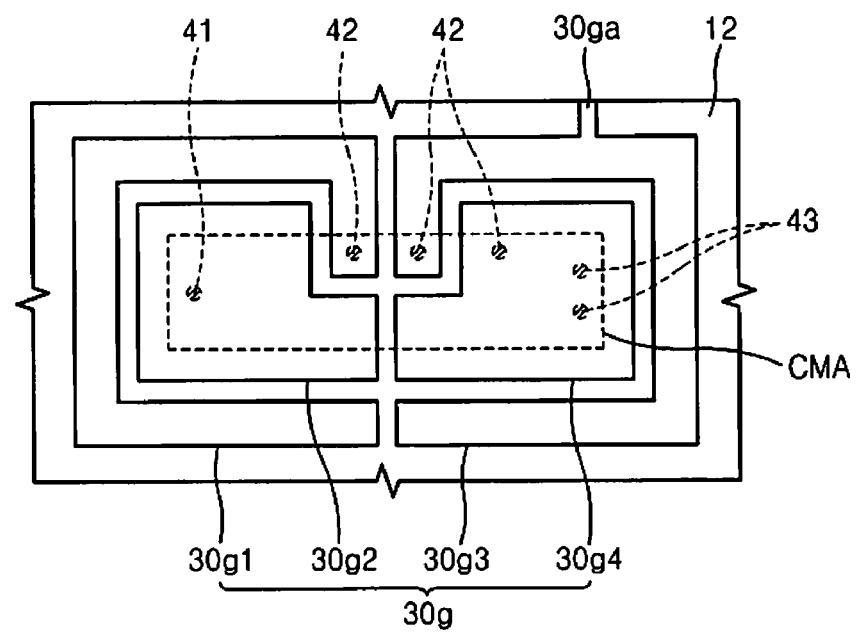
FIG. 17 illustrates a second conductive pattern in accordance with example embodiments.

FIG. 17 illustrates a second conductive pattern 30g in accordance with example embodiments. In example embodiments, the second conductive pattern 30g may be separated into at least two ground portions 30g1, 30g3 and at least two power portions 30g2, 30g4.

In example embodiments, the chip 80 may be a SOC system on-chip (SOC) having at least two circuits, for example, logic circuits, operation circuits and/or communication circuits. For example, one or more of the second conductive patterns 30g1, 30g2 may be connected to a logic circuit and one or more other second conductive patterns 30g3, 30g4 may be connected to an operation circuit. In example embodiments, ground signals may be applied to the ground portions 30g1, 30g3 and power signals may be applied to the power portions 30g2, 30g4. In example embodiments, one or more extended patterns 30ga may optionally be formed on the second surface 12 of the base film 121 for external connection.

In example embodiments shown in FIG. 17, each of the at least two ground portions 30g1, 30g3 substantially surrounds the at least two power portions 30g2, 30g4, respectively. In such example embodiments, EMI from the at least two power portions 30g2, 30g4 may be reduced.

In example embodiments, the power portions 30g2, 30g4 may have the shape of a letter "C." The power portions 30g2, 30g4 may surround the ground portions 30g1, 30g3.

Figure 18:
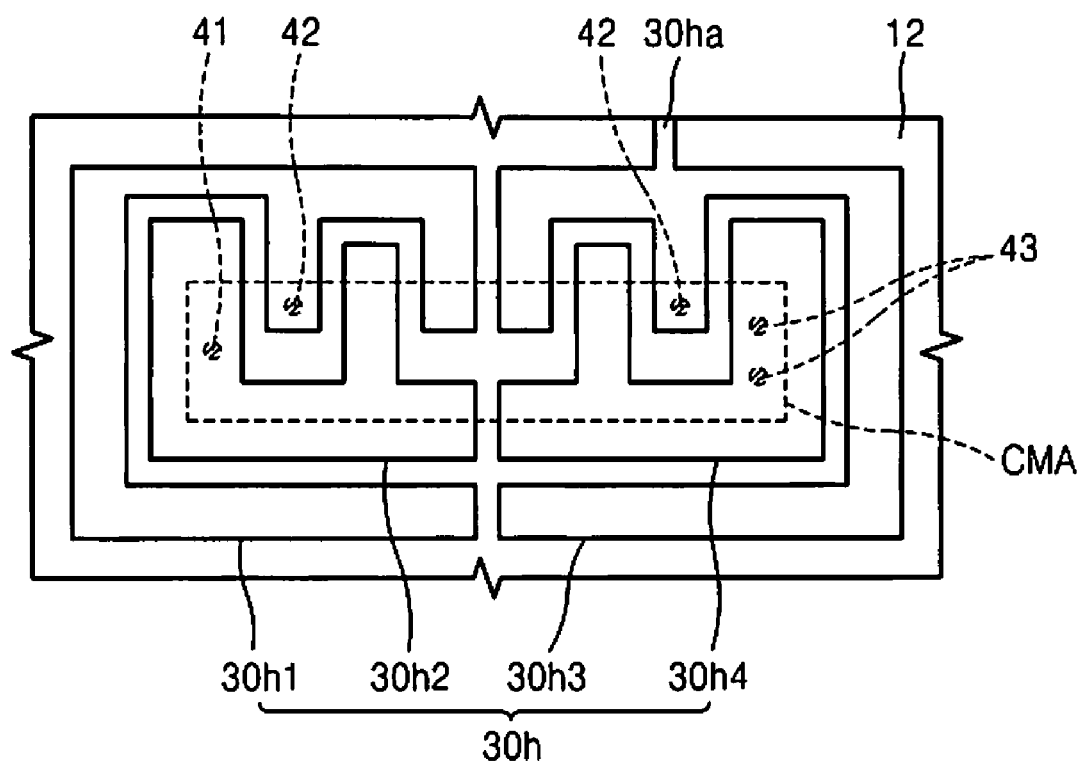
FIG. 18 illustrates a second conductive pattern in accordance with example embodiments.

FIG. 18 illustrates a second conductive pattern 30h in accordance with example embodiments. In example embodiments, the second conductive pattern 30*h* may be separated into at least two ground portions 30*h*1, 30*h*3 and at least two power portions 30*h*2, 30*h*4.

As discussed above in conjunction with FIG. 12, the second conductive pattern 30*g* and the second conductive pattern 30*h* may reduce thermal stress, for example, during operation (generally, the time when thermal stress is generated), reduce warpage, reduce an "electrical open" problem between the semiconductor chip 80 and base film 121, exhibit improved EMI characteristics and/or permit improved chip pad designs (chip pad locations).

In example embodiments, the chip 80 may be a SOC system on-chip (SOC) having at least two circuits, for example, logic circuits, operation circuits and/or communication circuits. For example, one or more of the second conductive patterns 30*h*1, 30*h*2 may be connected to a logic circuit and one or more other second conductive patterns 30*h*3, 30*h*4 may be connected to an operation circuit. In example embodiments, ground signals may be applied to the ground portions 30*h*1, 30*h*3 and power signals may be applied to the power portions 30*h*2, 30*h*4. In example embodiments, one or more extended patterns 30*ha* may optionally be formed on the second surface 12 of the base film 121 for external connection.

In example embodiments show in FIG. 17, each of the at least two ground portions 30*h*1, 30*h*3 substantially surrounds the at least two power portions 30*h*2, 30*h*4, respectively. In such example embodiments, EMI from the at least two power portions 30*h*2, 30*h*4 may be reduced.

In example embodiments, the second conductive pattern 30*a* may have various shapes to block EMI. In example embodiments, the second conductive pattern 30*a* may have a comb shape. The power portions 30*h*2, 30*h*4 may surround the ground portions 30*h*1, 30*h*3.

Although the above example embodiments show the power layers may surround the ground layers, it will be appreciated that the ground layers may surround the power layers. Further, in the above example embodiments, the lower metal layer may have ground layers of the same shape and/or power layers of the same shape. In alternative embodiment, a given lower metal layer may have ground layers of different shapes and/or power layers of different shapes.

Although described in connection with the second conductive pattern 30, each of the above variations may be applied to the first conductive pattern 20 and/or the second conductive pattern 30.

Figure 19:
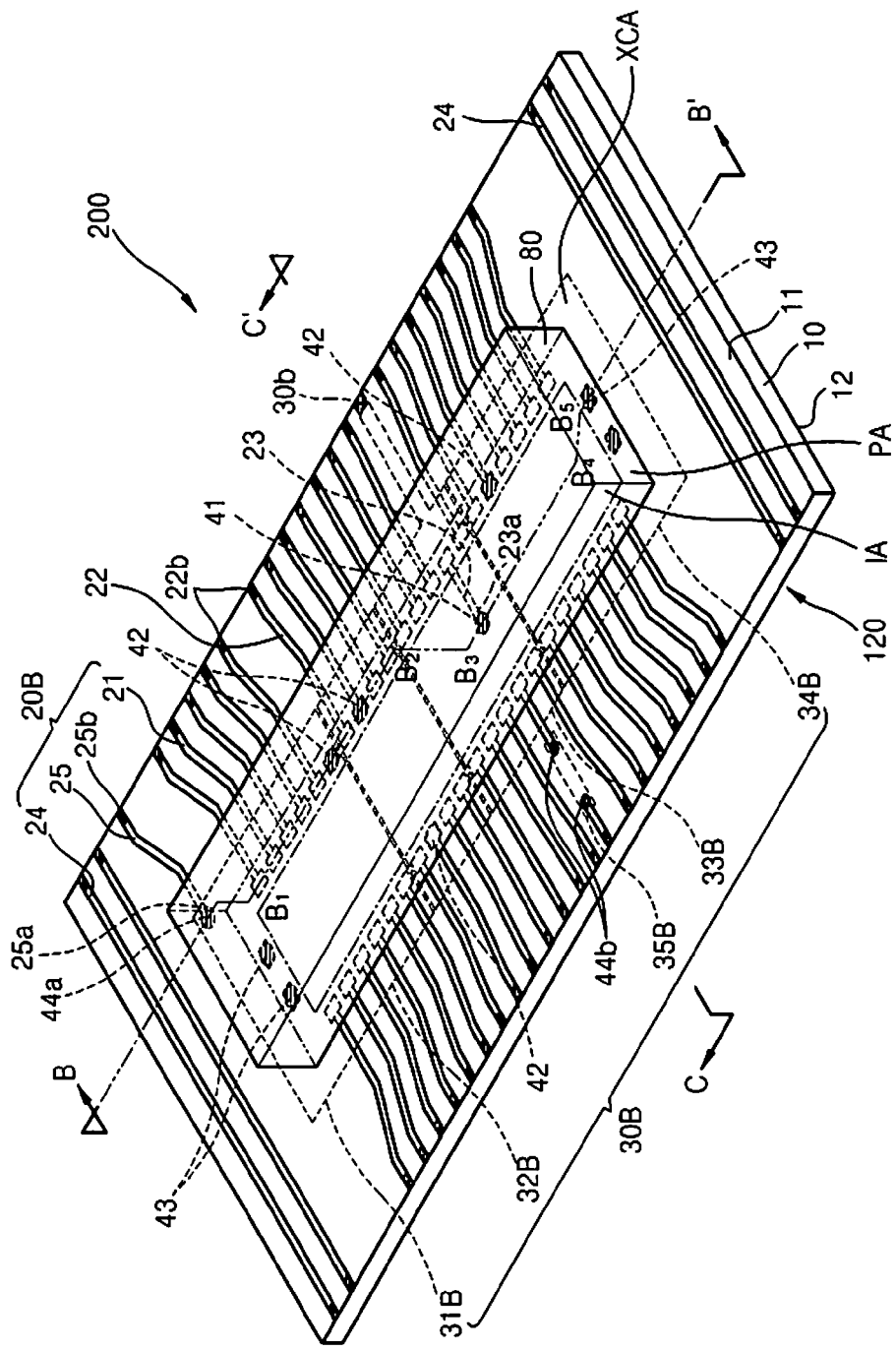
FIG. 19 illustrates an example chip and an example film of a COF in accordance with example embodiments.

FIG. 19 illustrates an example chip and an example film of a COF 200 in accordance with example embodiments.

Referring to FIG. 19, the film 120 may include the base film 121 (for example, a film substrate 10) further including a first surface 11 and a second surface 12. The base film 121 may include a first conductive pattern 20B and a second conductive pattern 30B. The first conductive pattern 20B may include first interconnections 21, second interconnections 22, third interconnections 23, fourth interconnections 24, and/or fifth interconnections 25. Any or all of the first interconnections 21 may include end portions 21*a*, any or all of the second interconnections 22 may include end portions 22*a*, any or all of the third interconnections 23 may include end portions 23*a*, any or all of the fourth interconnections 24 may include end portions 24*a* and/or any or all of the fifth interconnections 25 may include end portions 25*a*.

Any or all of the first interconnections 21 may include leads for external connection 21*b*, any or all of the second interconnections 22 may include leads for external connection 22*b*, any or all of the third interconnections 23 may include leads for external connection 23*b*, any or all of the fourth interconnections 24 may include leads for external connection 24*b* and/or any or all of the fifth interconnections 25 may include leads for external connection 25*b*.

As shown in FIG. 19, the second conductive pattern 30B may include a one or more ground patterns 31B, 34B, one or more power patterns 32B, and one or more redistribution patterns. The base film 121 may have one or more vias 40A at various locations 41, 42, 43, 44*a*, 44*b*.

As shown in FIG. 19, the chip 80 may be placed on the film 120. As discussed above with reference to FIG. 7, the surface covered by the chip 80 may be divided into chip peripheral areas PA and a chip inner area IA. As shown in FIG. 19, the surface uncovered by the chip 80 may be referred to as the external chip area XCA.

The one or more vias 40A, 41, 42, 43 44*a*, 44*b* will be described in more detail with regard to locations B1-B5 along the axis B-B' in FIG. 20 and axis C-C' in FIG. 21.

Figure 20:
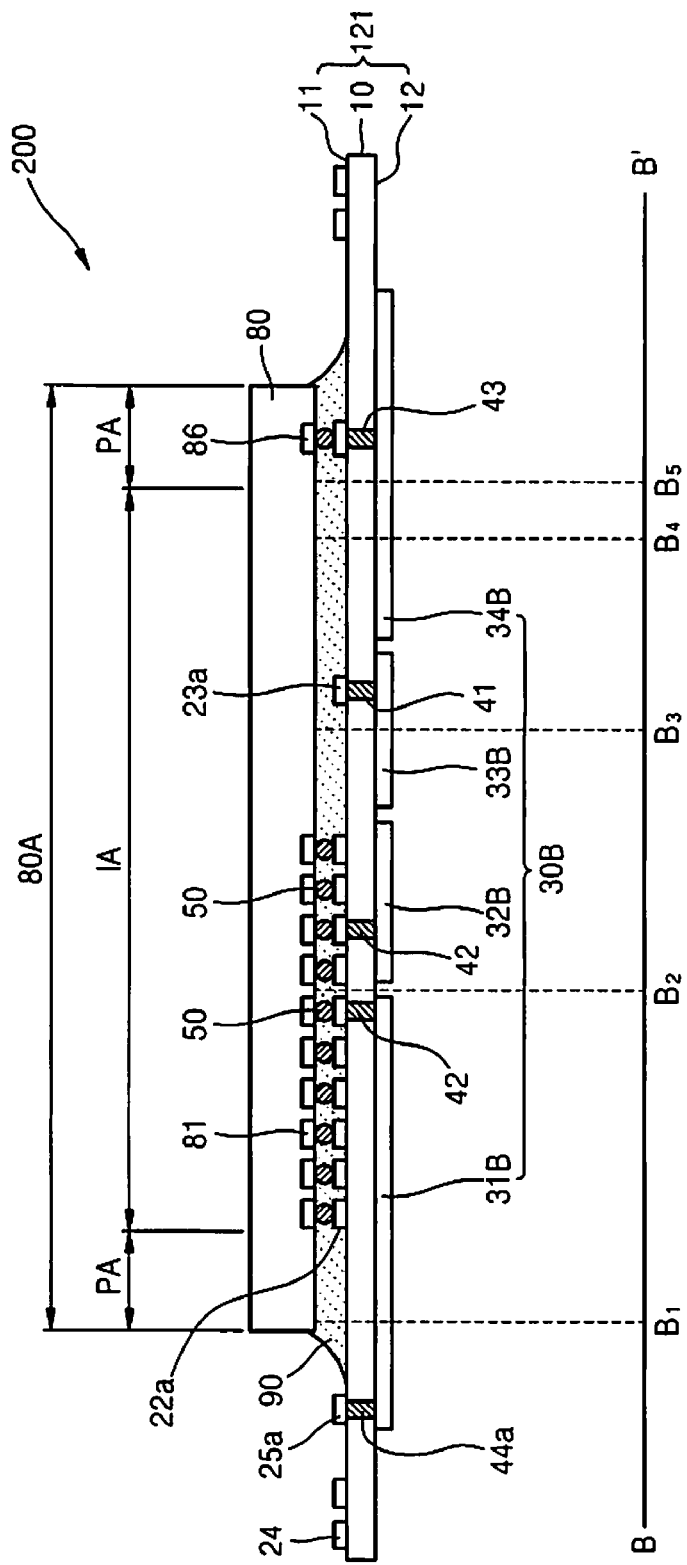
FIG. 20 illustrates an example cross-section of the example COF of FIG. 19 along B-B'.

FIG. 20 illustrates an example cross-section of the example COF of FIG. 19 along B-B'. As shown in FIG. 20, the chip 80 may be placed on the film 120. As discussed above with reference to FIG. 7, the surface 80A defined by the chip 80 may be divided into chip peripheral areas PA and a chip inner area IA.

As shown in FIG. 20, the chip 80 may have active pads 81 and dummy pads 86. The active pads 81 and the dummy pads 86 may be connected to the first metal pattern 20B, for example, end patterns 22*a*, by solders balls 50 (or conductive bumps). The first metal pattern 20B may be considered an upper metal pattern due to its orientation above the base film 121. The first metal pattern 20B may be connected to the second metal pattern 30A by vias 41, 42, 43, and 44*a*. The second metal pattern 30B may be considered a lower metal pattern due to its orientation below the base film 121. In example embodiments, the second conductive pattern 30B may include a one or more patterns 31B, 32B, 33*b*, 34*b*, each of which may be one or more ground patterns, one or more power patterns, one or more signal patterns, one or more redistribution patterns, and one or more dummy patterns. In example embodiments, a thickness of second metal layer 30B is thicker than that of the first metal layer 20B, which may reduce resistance caused by pitch limitations of the interconnections 21, 22, 23, 24, and/or 25.

In example embodiments, a first solder ball (or conductive bump) 50 connected to a via 41, 42, 43, 44 may be larger than a second solder ball (or conductive bump) 50 not connected to a via 41, 42, 43, 44. Input signals such as power or ground may be affected by noise. Also, wiring pattern resistance and EMI noise may also be problems. Example embodiments may solve one or all of these problems if the size of the first solder ball (or conductive bump) 50 connected to a via 41, 42, 43, 44 is as large as possible.

In example embodiments, the interconnections 21, 22, 23, 24, and/or 25, the solders balls 50, and/or the vias 40A, 41, 42, 43 may overlap. For example, as shown in FIG. 20, end portions 22*a* of interconnections 22, the solder ball 50, and the via 42 overlap.

As shown in FIG. 20, the dummy pad 86 is connected to the pattern 34B. As a result, the pattern 34B may be a ground pattern or a heat sink. As shown in FIG. 20, the patterns 31B may be a ground pattern, the pattern 32B may be a signal pattern, and the pattern 33B may be a power pattern.

In example embodiments, the at least one chip 80 may be disposed on the film substrate 10. In example embodiments, the at least one chip 80 may be attached to the film substrate 10 by a tape automated bonding (TAB) method. In example embodiments, the at least one chip 80 may be surrounded by a molding material 90. In example embodiments, a portion of the first conductive pattern 20A and the second conductive pattern 30, 30A may be electrically connected through one or more vias 40A, 41, 42, 43.

In example embodiments, a portion of the first conductive pattern 20A and the second conductive pattern 30, 30A may be electrically connected through one or more vias 44a, 44b, in the external chip area XCA.

In example embodiments, the second conductive pattern 30A may be used for heat dissipation, for example, to reduce or prevent warpage of the COF. In example embodiments, ground and/or power signals may be transmitted via the second conductive pattern 30A, so that it is possible to increase the conductive area of the ground and/or power signals.

Figure 21:
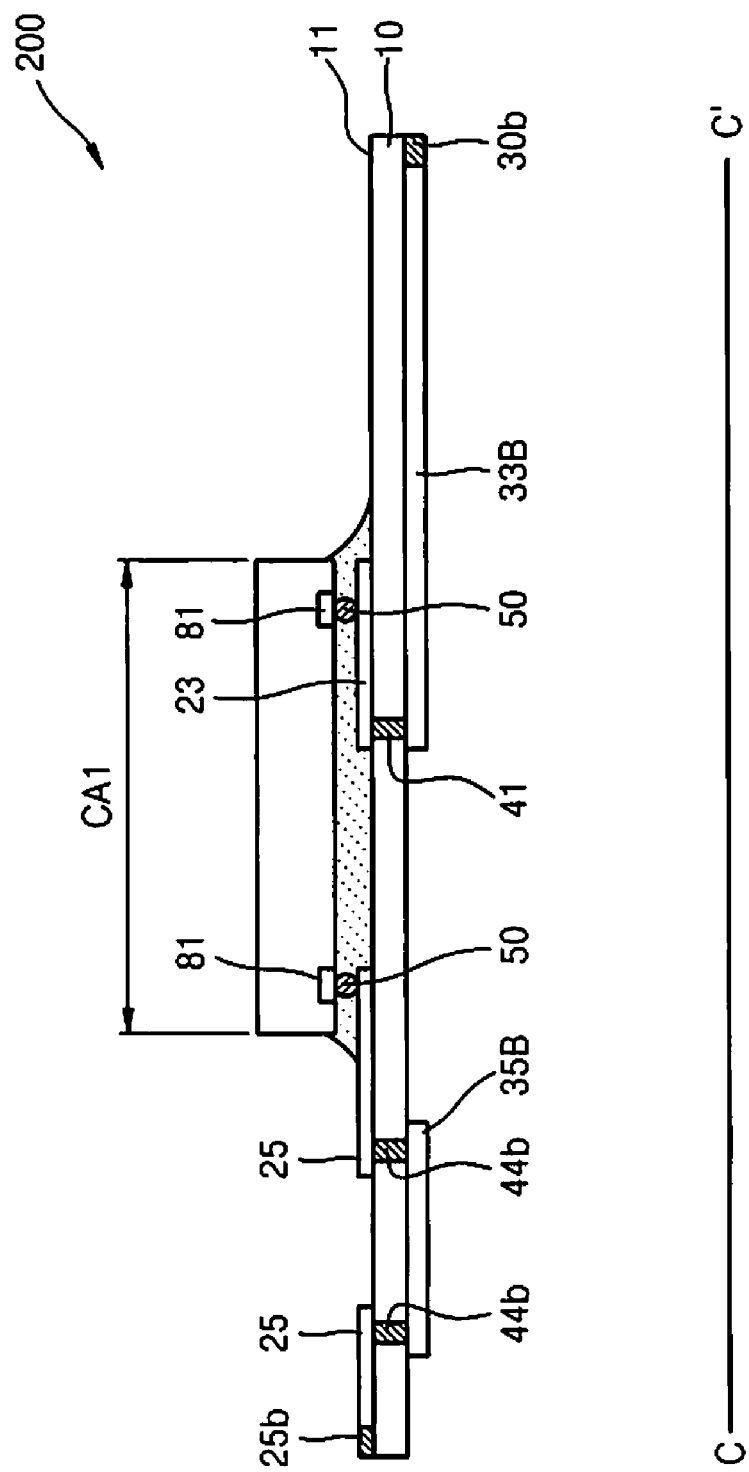
FIG. 21 illustrates an example cross-section of the example COF of FIG. 19 along C-C'.

FIG. 21 illustrates an example cross-section of the example COF of FIG. 19 along C-C'. As shown in FIG. 21, via 41 in the inner area IA may connect the interconnection 23 of the first conductive pattern 20B with the power pattern 33B of the second conductive pattern 30B. The pad 81 may be connected to the interconnection 25 by a solder ball 50. The interconnection 25 may be connected to a portion of the second conductive pattern 35B by a via 44b. As shown, via 44b is outside of the chip 80 in the external chip areas XCA. In example embodiments, a thickness of the power pattern 33B is thicker than that of the interconnection 25.

The portion of the second conductive pattern 35B may be connected to another portion of interconnection 25 by another via 44b, also outside of the chip 80 in the external chip areas XCA. The interconnection 25 may include an external connection 25b and the power pattern 33B may include an external connection 30b for use in connecting to an external device, described below. The external connection 25b and the external connection 30b may be on opposite surfaces of the base film 121.

Figure 22:
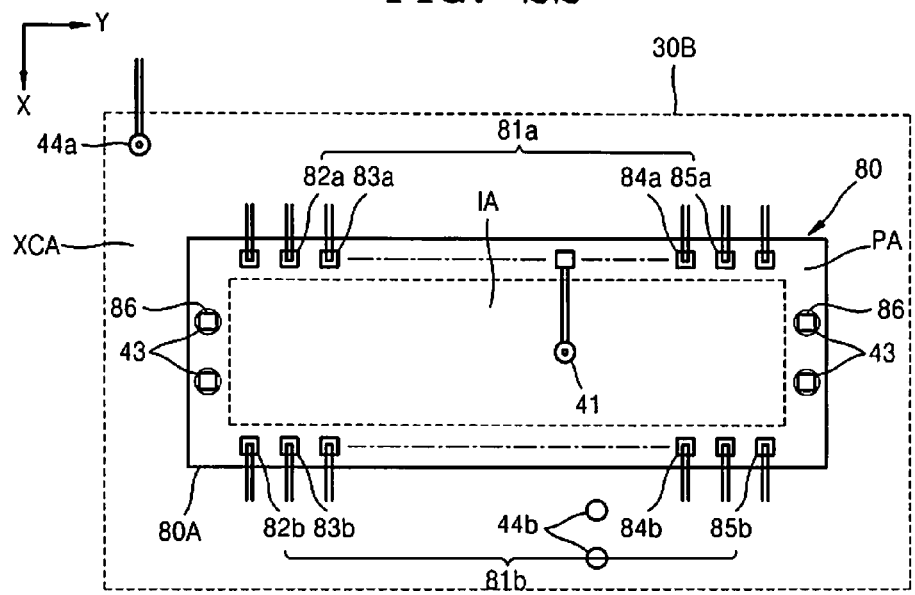
FIG. 22 illustrates a first surface of an example chip of a COF and connections to an example film of a COF in accordance with example embodiments.

FIG. 22 illustrates the first surface 80A of an example chip 80 of a COF and connections to an example film 120 of a COF in accordance with example embodiments.

The chip 80 may include one or more plurality of pads 81 on one or more sides of the chip 80. The first plurality of pads 81a on a first edge of a first side of the chip 80 may include one or more ground pads 82a, 85a, one or more power pads 83a, and/or one or more signal pads 84a.

The second plurality of pads 81b on a second edge of the first side of the chip 80 may include one or more ground pads 82b, 85b, one or more power pads 83b, and/or one or more signal pads 84b.

One or more dummy pads 86 may also be provided on the chip 80.

As shown in FIG. 22, the vias 41 are in the inner area IA of the chip 80, the vias 43 are in the peripheral areas PA, and the vias 44a, 44b are in the external chip area XCA. In example embodiments, the peripheral areas PA may be defined as the areas which contain the one or more plurality of pads 81. In example embodiments, the inner area IA may be defined as the area under the chip 80 which contains none of the one or more plurality of pads 81. In example embodiments, the external chip area XCA may be defined as the area outside of the chip 80. In example embodiments, the external chip area XCA may contain none of the one or more plurality of pads 81.

As shown in FIG. 22, the peripheral areas PA surround the inner area IA and the external chip area XCA surrounds the peripheral areas PA. As shown in FIG. 22, the peripheral areas PA, the inner area IA, and the external chip area XCA may also be distinguished by the presence or absence of the one or more plurality of pads 81, although this need not be the case. For example, although the one or more plurality of pads 81a and 81b are in a straight line in the y-direction in FIG. 22, the one or more plurality of pads 81a and 81b may be staggered toward and/or away from the inner area IA along the x-direction and possibly be located within the inner area IA and/or the external chip area XCA.

In example embodiments, the peripheral areas PA may be defined as the areas which contain the predominant numbers of the one or more plurality of pads 81. In example embodiments, the peripheral areas PA may be defined as the areas which contain the majority of the one or more plurality of pads 81a and 81b. In example embodiments, the peripheral areas PA may be defined as the areas which contain the predominant area of the one or more plurality of pads 81a and 81b. In example embodiments, the peripheral areas PA may be defined as the areas which contain the majority area of the one or more plurality of pads 81a and 81b.

In example embodiments, the inner area IA may be defined as the areas which contain a few of the one or more plurality of pads 81a and 81b. In example embodiments, the inner area IA may be defined as the areas which contain the minority of the one or more plurality of pads 81a and 81b. In example embodiments, the inner area IA may be defined as the area which contains a small area of the one or more plurality of pads 81a and 81b. In example embodiments, the inner area IA may be defined as the area which contains the minority area of the one or more plurality of pads 81a and 81b.

In example embodiments, the external chip area XCA may be defined as the areas which contain a few of the one or more plurality of pads 81a and 81b. In example embodiments, the external chip area XCA may be defined as the areas which contain the minority of the one or more plurality of pads 81. In example embodiments, the external chip area XCA may be defined as the area which contains a small area of the one or more plurality of pads 81. In example embodiments, the external chip area XCA may be defined as the area which contains the minority area of the one or more plurality of pads 81a and 81b.

In example embodiments, the vias 44a, 44b may be anywhere in the external chip area XCA.

Figure 23A:
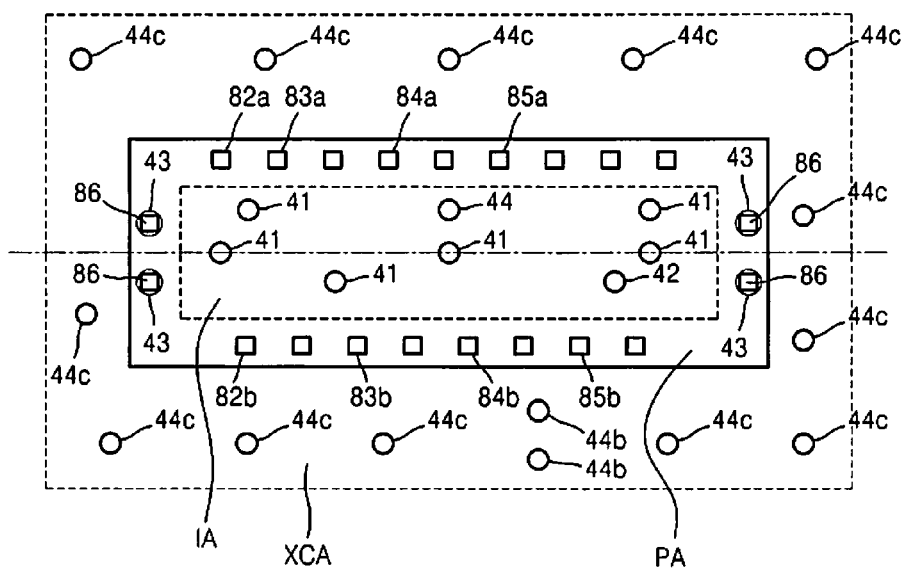
FIG. 23A illustrates a first surface of an example chip of a COF and connections to an example film of a COF in accordance with example embodiments.

FIG. 23A illustrates a first surface of an example chip of a COF and connections to an example film of a COF in accordance with example embodiments. As shown, any number of vias 41 may be located anywhere in the inner area IA. Any number of vias 43 may be located anywhere in the peripheral area PA. Any number of vias 44a, 44b may be located anywhere in the external chip area XCA. Any combination of vias 41, vias 43, and vias 44a, 44b may be provided in a COF.

Figure 23B:
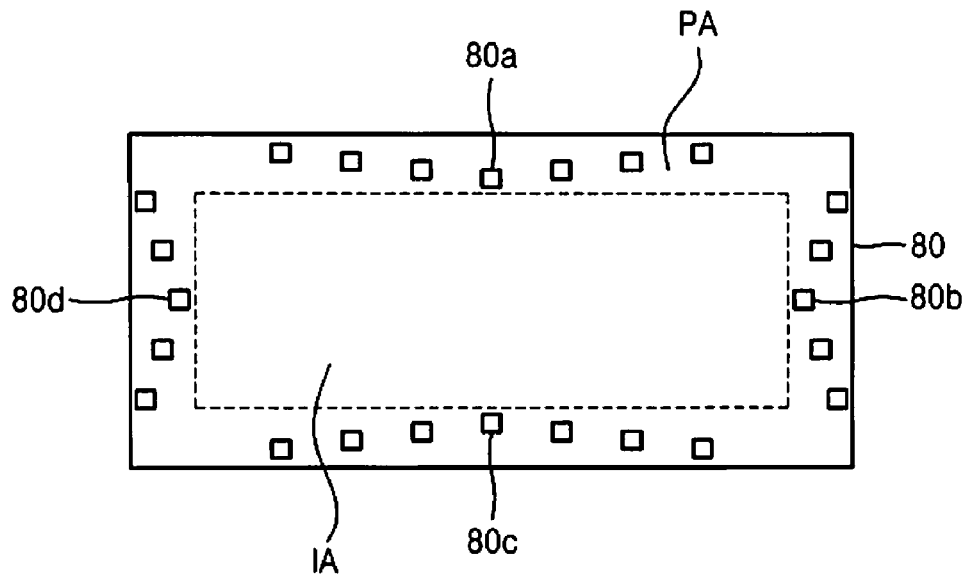
FIG. 23B illustrates a first surface of an example chip of a COF and connections to an example film of a COF in accordance with example embodiments.

FIG. 23B illustrates a first surface of an example chip of a COF and connections to an example film of a COF in accordance with example embodiments. As shown, the peripheral area PA may be located from one or more edges of the semiconductor chip 80 to an innermost bump region of the semiconductor chip 80, for example, defined by the location of the innermost bump 80a, 80b, 80c, and/or 80d on the semiconductor chip 80. As shown, the inner area IA may be defined as the remainder of the semiconductor chip 80. Any number of vias 41 may be located anywhere in the inner area IA. Any number of vias 43 may be located anywhere in the peripheral area PA. Any number of vias 44a, 44b may be located anywhere in the external chip area XCA. Any combination of vias 41, vias 43, and vias 44a, 44b may be provided in a COF.

Figure 23C:
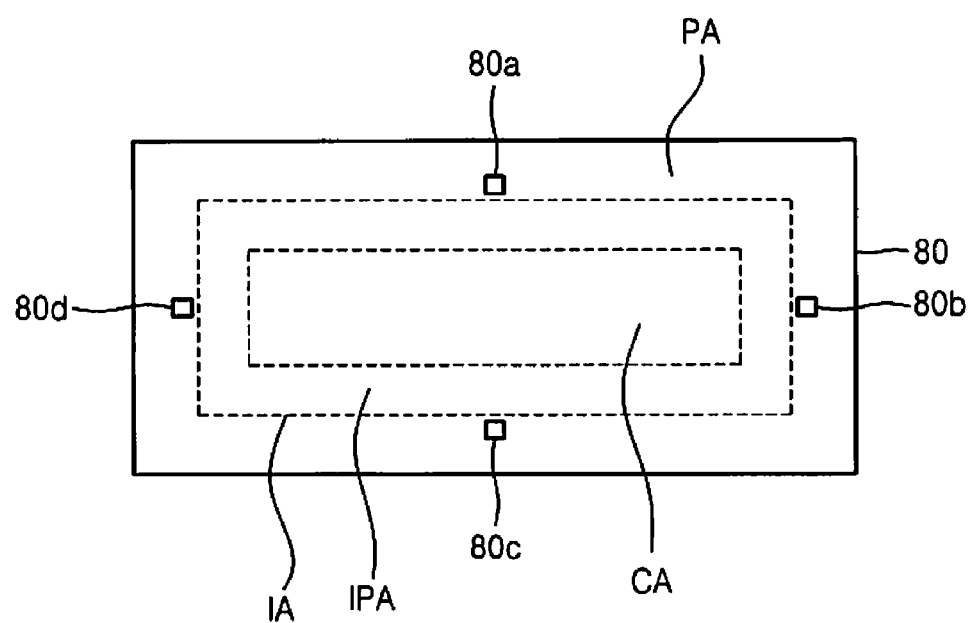
FIG. 23C illustrates a first surface of an example chip of a COF and connections to an example film of a COF in accordance with example embodiments.

FIG. 23C illustrates a first surface of an example chip of a COF and connections to an example film of a COF in accordance with other example embodiments. As shown, the inner area IA may further include an inner peripheral area IPA and a center area CA. As shown, any number of vias 41 may be located anywhere in the inner area IA, inner peripheral area IPA, and/or center area CA. Any number of vias 43 may be located anywhere in the peripheral area PA. Any number of vias 44a, 44b may be located anywhere in the external chip area XCA. Any combination of vias 41, vias 43, and vias 44a, 44b may be provided in a COF.

In example embodiments, vias 41 may be provided in the inner area IA (either the inner peripheral area IPA and/or the center area CA). In example embodiments, vias 44a may be provided in the external chip area XCA. In example embodiments, vias 41 may be provided in the inner area IA (either the inner peripheral area IPA and/or the center area CA) and vias 44a may be provided in the external chip area XCA. In example embodiments, vias may be provided anywhere or everywhere.

Figure 24:
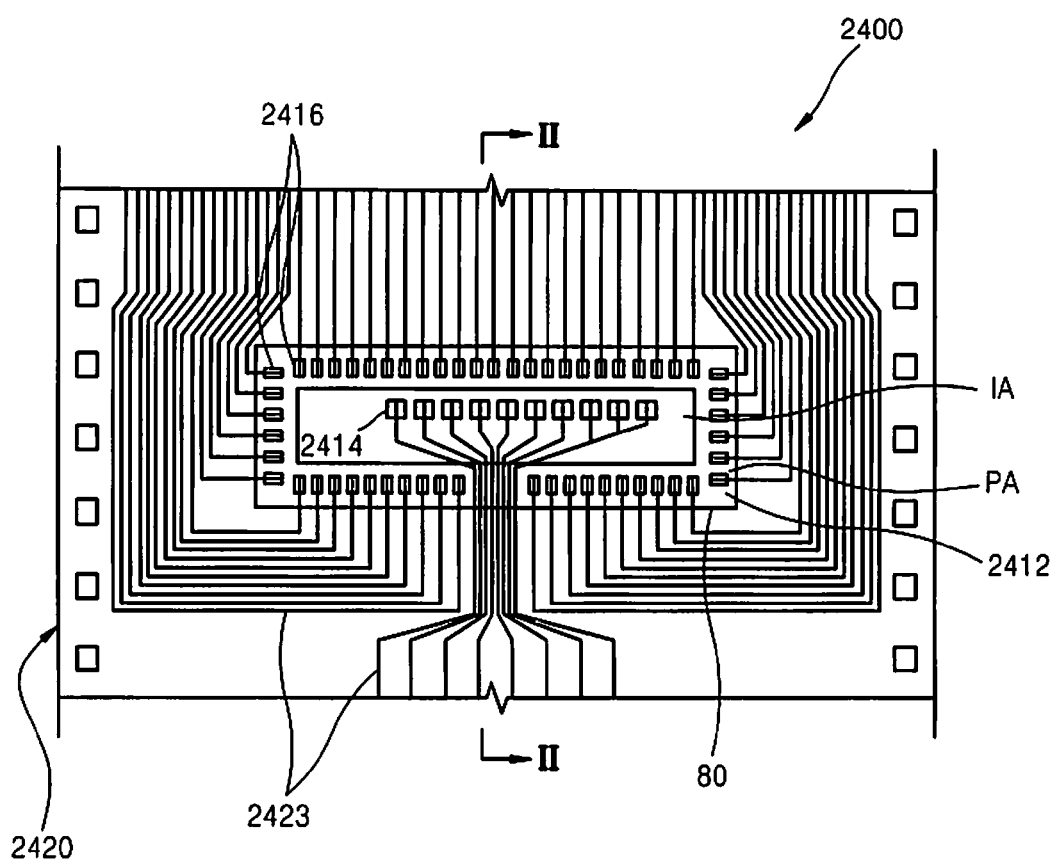
FIG. 24 is a plan view of a COF package in accordance with example embodiments.
Figure 25A:
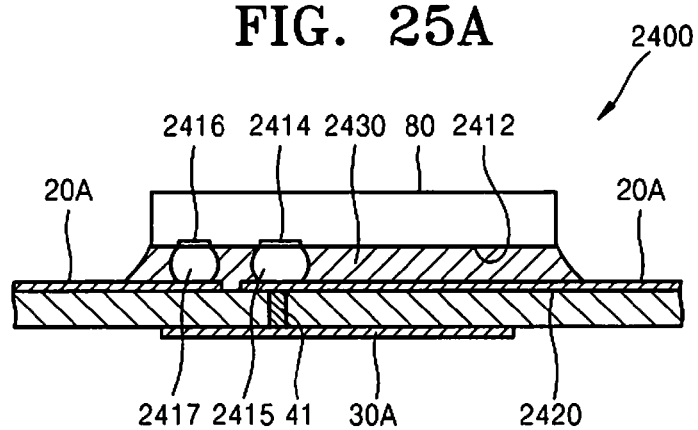
FIG. 25A is a cross-sectional view taken along the line II-II of FIG. 24.
Figure 25B:
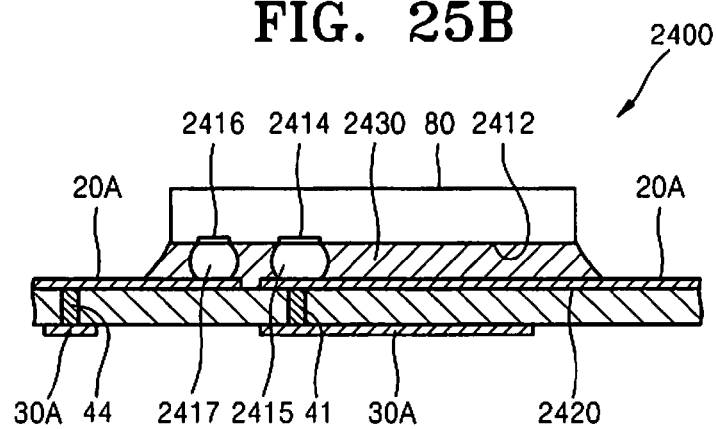
FIG. 25B is an alternative cross-sectional view taken along the line II-II of FIG. 24.
Figure 25C:
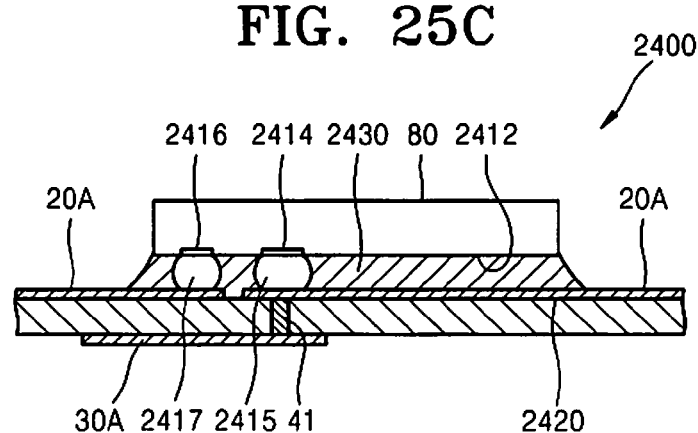
FIG. 25C is another alternative cross-sectional view taken along the line II-II of FIG. 24.

FIG. 24 is a plan view of a COF package in accordance with example embodiments. FIG. 25A-25C are example cross-sectional views taken along the line II-II of FIG. 24.

Referring to FIGS. 24 and 25A-25C, a COF package 2400 may include a semiconductor chip 80 and a tape wiring substrate 2420 having wiring patterns 2423. The semiconductor chip 80 may be inner lead-bonded to the tape wiring substrate 2420. The semiconductor chip 80 may include an active surface 2412 with input pads 2414 and output pads 2416 formed thereon. The output pads 2416 may be formed in a peripheral area PA of the active surface 2412. The input pads 2414 may be formed in an inner area IA of the active surface 2412. The input pads 2414 may have input metal bumps 2415 and the output pads 2416 may have output metal bumps 2417. The wiring patterns 2423 may be simultaneously inner lead-bonded to the input/output pads 2414 and 2416 through the metal bumps 2415 and 2417, respectively. The inner lead-bonded portion may be sealed using a liquid molding compound 2430 through an underfill process.

The active surface 2412 of the semiconductor chip 80 may be formed of a rectangle with two relatively longer opposing sides. In example embodiments, the peripheral area PA includes all the output pads 2416/output metal bumps 2417. In example embodiments, one or more of the input pads 2414/input metal bumps 2415 may be disposed in the peripheral area PA (not shown). In example embodiments, only one or more of the input pads 2414/input metal bumps 2415 may be disposed in the inner area IA.

As a result, in example embodiments, the peripheral area PA may be defined by the location of the output pads 2416/output metal bumps 2417 and/or the inner area IA may be defined as an area delineated or bounded, by the output pads 2416/output metal bumps 2417.

In other example embodiments, the peripheral area PA may be defined by first, or outermost, rows of output pads 2416/output metal bumps 2417 disposed along the two relatively longer opposing sides of the semiconductor chip 80. In example embodiments, if there are two or more rows of the output pads 2416/output metal bumps 2417 on the semiconductor chip 80, the outermost rows of the output pads 2416/output metal bumps 2417 may be disposed in the peripheral area PA and other output pads 2416/output metal bumps 2417 may be disposed in the inner area IA.

In example embodiments, the input pads 2414/input metal bumps 2415 may be in the inner area IA of the active surface 112, instead of in the peripheral area PA.

In example embodiments, the input pads 2414/input metal bumps 2415 may be in the inner area IA of the active surface 112 may lower input resistance, for example, caused by wiring patterns formed in the semiconductor chip and/or facilitate distributing input signals, for example, Vcc or ground, to multiple regions of the semiconductor chip.

As shown, in FIGS. 25A-25C, the relationship between an active surface of the semiconductor chip 80 and the second metal layer 30A may be varied. For example, the second metal layer 30A may be larger, smaller, or the same size as an active surface of the semiconductor chip 80. In example embodiments, the second metal layer 30A may be entirely within a boundary of an active surface of the semiconductor chip 80 (for example, FIG. 25A). In example embodiments, the second metal layer 30A may be partially outside a boundary of an active surface of the semiconductor chip 80 (for example, FIG. 25C). In example embodiments, the second metal layer 30A may include one or more portions. In example embodiments, one or more portions of the second metal layer 30A may be entirely within a boundary of an active surface of the semiconductor chip 80 and other portions may be partially outside a boundary of an active surface of the semiconductor chip 80 (for example, FIG. 25B).

Figure 26A:
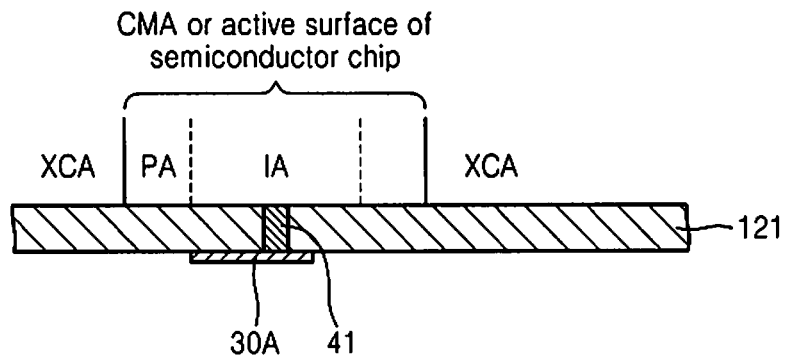
FIGS. 26A-26C illustrate additional example embodiments, similar to example embodiments illustrated in FIGS. 6-18.
Figure 26B:
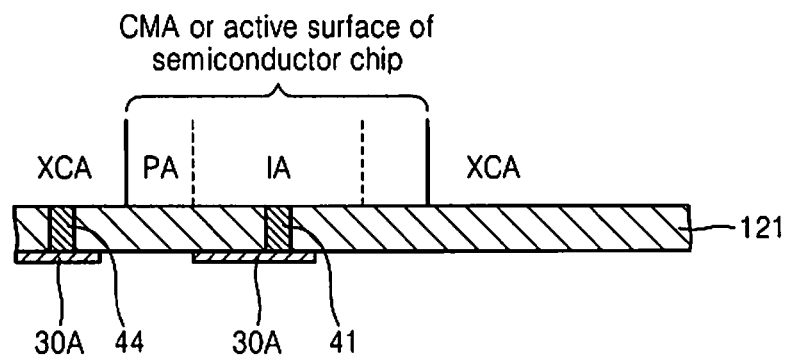
Figure 26C:
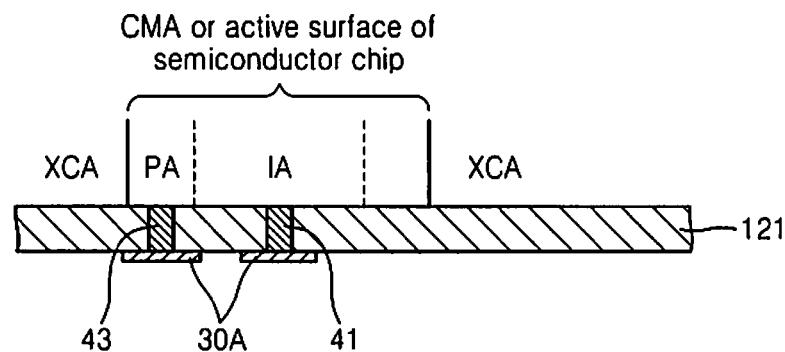

FIGS. 26A-26C illustrate additional example embodiments, similar to example embodiments illustrated in FIGS. 6-18. As shown, a chip mounting area CMA or a surface of a chip 80 may be the basis for determining a peripheral area PA, an inner area IA, and/or an external chip area XCA. In example embodiments, a chip mounting area CMA may be larger than, smaller than or the same size as a surface of a chip 80. The XCA may be generally defined as an area outside the boundary of either a chip mounting area CMA or a surface of a chip 80. FIG. 26A illustrates a via 41 in the inner area IA, FIG. 26B illustrates an additional via 44 in the external chip area XCA, and FIG. 26C illustrates an additional via 43 in the peripheral area PA.

Figure 27A:
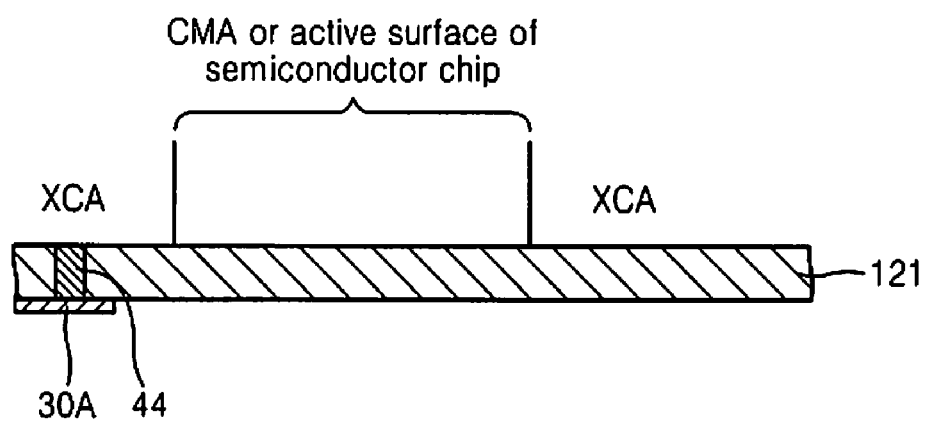
FIGS. 27A-27B illustrate additional example embodiments, similar to example embodiments illustrated in FIGS. 19-23C.
Figure 27B:
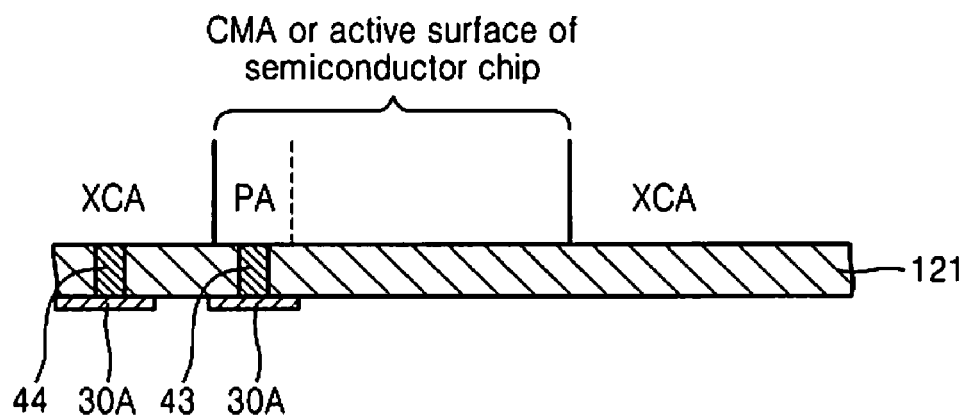

FIGS. 27A-27B illustrate additional example embodiments, similar to example embodiments illustrated in FIGS. 19-23C. As shown, a chip mounting area CMA or a surface of a chip 80 may be the basis for determining a peripheral area PA, an inner area IA, and/or an external chip area XCA. In example embodiments, a chip mounting area CMA may be larger than, smaller than or the same size as a surface of a chip 80. The XCA may be generally defined as an area outside the boundary of either a chip mounting area CMA or a surface of a chip 80. FIG. 27A illustrates a via 44 in the external chip area XCA and FIG. 27B illustrates an additional via 43 in the peripheral area PA.

Figure 28:
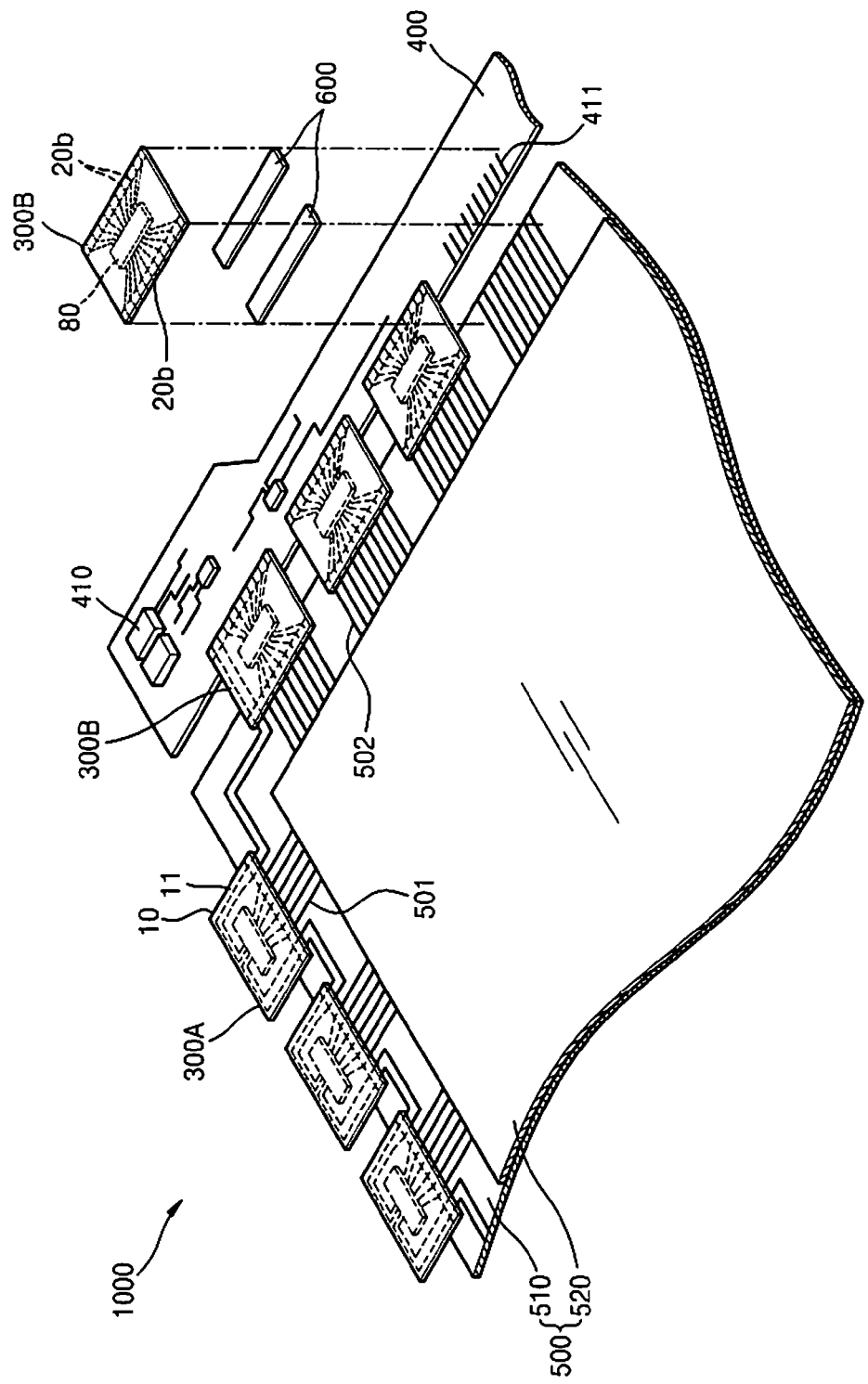
FIG. 28 illustrates a display assembly including at least one COF according to example embodiments.

FIG. 28 illustrates a display assembly 1000 including at least one COF according to example embodiments. As shown COFs 300a, 300b may be connected to an LCD panel 500. The LCD panel may include a base substrate 510 and the LCD panel 520. The LCD panel may also include gate lines 501 and data lines 502 that connect the LCD panel 520 to the COFs 300a, 300b.

One or more COFs 300b may connect the LCD panel 500 to a PCB 400. The PCB 400 may include at least one operation chip 410 and lines 411. A COF 300b may connect the LCD panel 500 and the PCB 400 by elements 600.

In example embodiments, the COF packages 300b may be connected to the LCD panel 500 and the PCB 400 facing the second surface of the base film. If the first surface of the base film 121 is connected to the LCD panel 500 and the PCB 400, the second conductive pattern will face upward, which may increase heat dissipation.

Although at least one COF according to example embodiments has been described above as a component of a display assembly, example embodiments of COFs may also be implemented as a component or sub-component of a memory in one or more sub-system or system as described in more detail below.

Figure 29:
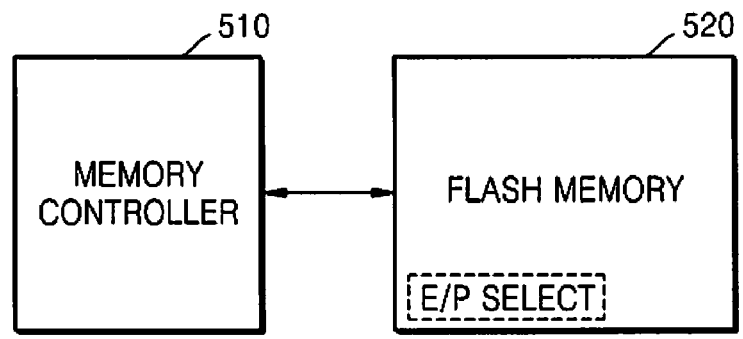
FIG. 29 illustrates an example embodiment including a memory controller in accordance with example embodiments.

FIG. 29 illustrates an example embodiment including a memory controller in accordance with example embodiments. As shown, FIG. 29 includes a memory 510 connected to a memory controller 520. The memory 510 may be a NAND flash memory or NOR flash memory. However, the memory 510 is not limited to these memory types, and may be any memory type.

The memory controller 520 may supply the input signals for controlling operation of the memory 510. For example, in the case of a NAND flash memory, the memory controller 520 may supply the command CMD and address signals. In examples of a NOR flash memory, the memory controller 520 may supply CMD, ADD, DQ and VPP signals. It will be appreciated that the memory controller 520 may control the memory 510 based on received control signals (not shown).

Figure 30:
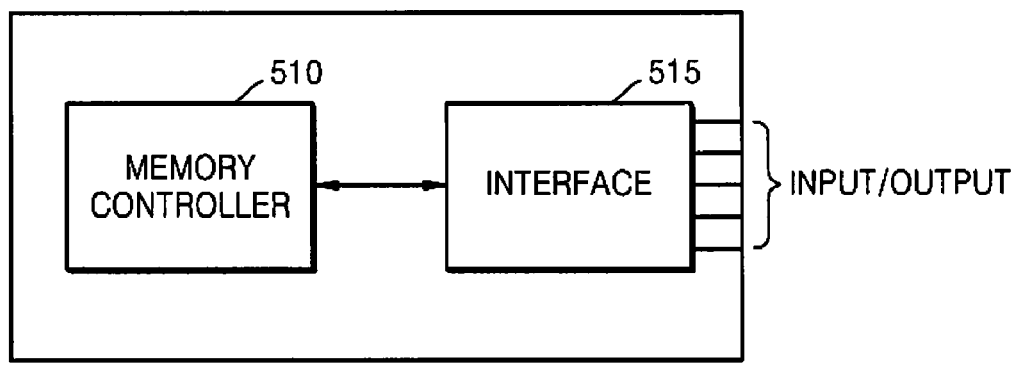
FIG. 30 illustrates another example embodiment including an interface in accordance with example embodiments.

FIG. 30 illustrates another example embodiment including an interface in accordance with example embodiments. As shown, FIG. 30 includes a memory 510 connected to an interface 515. The memory 510 may be a NAND flash memory or a NOR flash memory. However, the memory 510 is not limited to these memory types, and may be any memory type.

The interface 515 may supply the input signals (for example, generated externally) for controlling operation of the memory 510. For example, in the case of a NAND flash memory, the interface 515 may supply the command CMD and address signals. In the example of a NOR flash memory, the interface 515 may supply CMD, ADD, DQ and VPP signals. It will be appreciated that the interface 515 may control the memory 510 based on received control signals (for example, generated externally, but not shown).

Figure 31:
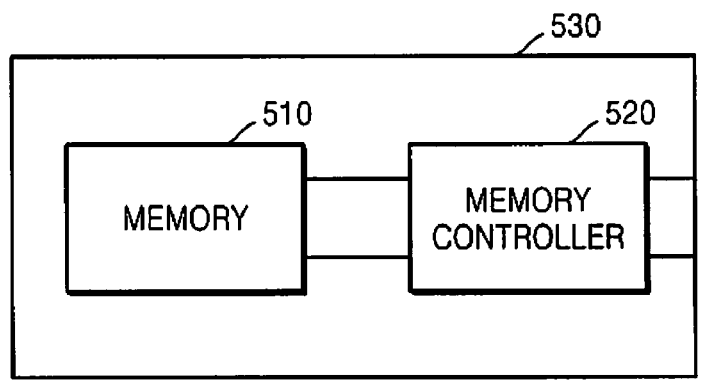
FIG. 31 illustrates an example memory card in accordance with example embodiments.

FIG. 31 illustrates an example memory card in accordance with example embodiments. FIG. 31 is similar to FIG. 29, except that the memory 510 and memory controller 520 have been embodied as a card 530. For example, the card 530 may be a memory card such as a flash memory card. Namely, the card 530 may be a card meeting any industry standard for use with a consumer electronics device such as a digital camera, personal computer, etc. It will be appreciated that the memory controller 520 may control the memory 510 based on controls signals received by the card 530 from another (e.g., external) device.

Figure 32:
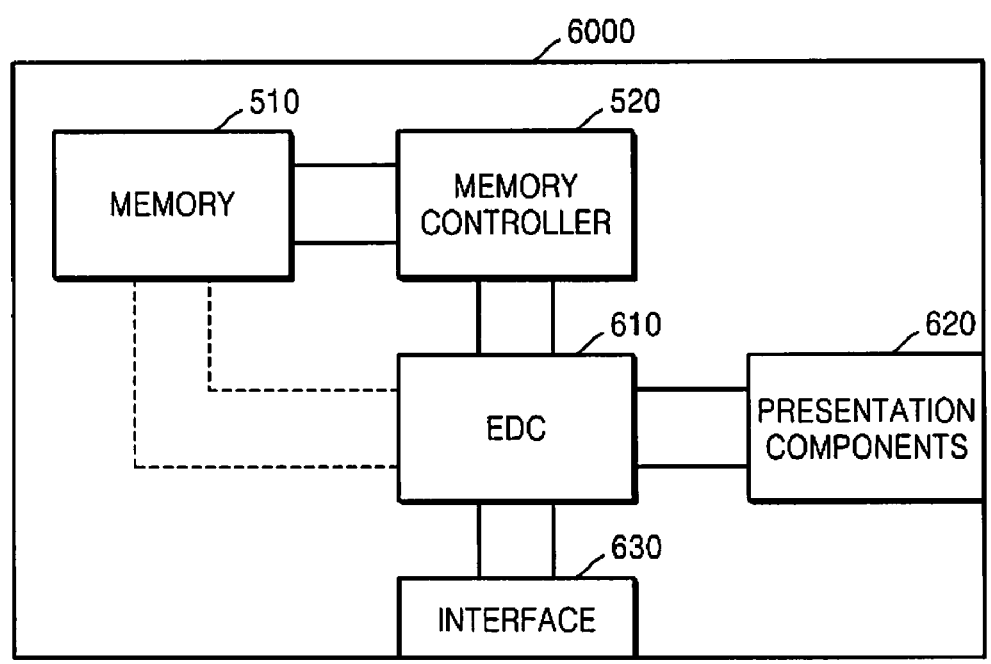
FIG. 32 illustrates an example portable device in accordance with example embodiments.

FIG. 32 illustrates an example portable device in accordance with example embodiments. FIG. 32 represents a portable device 6000. The portable device 6000 may be an MP3 player, video player, combination video and audio player, etc. As shown, the portable device 6000 includes the memory 510 and memory controller 520. The portable device 6000 may also includes an encoder and decoder 610, presentation components 620 and interface 630.

Data (video, audio, etc.) may be input to and output from the memory 510 via the memory controller 520 by an encoder and decoder (EDC) 610. As shown by the dashed lines in FIG. 32, the data may be directly input to the memory 510 from the EDC 610 and/or directly output from the memory 510 to the EDC 610.

The EDC 610 may encode data for storage in the memory 510. For example, the EDC 610 may perform MP3 encoding on audio data for storage in the memory 510. Alternatively, the EDC 610 may perform MPEG encoding (e.g., MPEG2, MPEG4, etc.) on video data for storage in the memory 510. Still further, the EDC 610 may include multiple encoders for encoding different types of data according to different data formats. For example, the EDC 610 may include an MP3 encoder for audio data and an MPEG encoder for video data.

The EDC 610 may decode output from the memory 510. For example, the EDC 610 may perform MP3 decoding on audio data output from the memory 510. Alternatively, the EDC 610 may perform MPEG decoding (e.g., MPEG2, MPEG4, etc.) on video data output from the memory 510. Still further, the EDC 610 may include multiple decoders for decoding different types of data according to different data formats. For example, the EDC 610 may include an MP3 decoder for audio data and an MPEG decoder for video data.

It will also be appreciated that EDC 610 may include only decoders. For example, already encoded data may be received by the EDC 610 and passed to the memory controller 520 and/or the memory 510.

The EDC 610 may receive data for encoding, or receive already encoded data, via the interface 630. The interface 630 may conform to a known standard (e.g., firewire, USB, etc.). The interface 630 may also include more than one interface. For example, interface 630 may include a firewire interface, a USB interface, etc. Data from the memory 510 may also be output via the interface 630.

The presentation components 620 may present data output from the memory, and/or decoded by the EDC 610, to a user. For example, the presentation components 620 may include a speaker jack for outputting audio data, a display screen for outputting video data, and/or etc.

Figure 33:
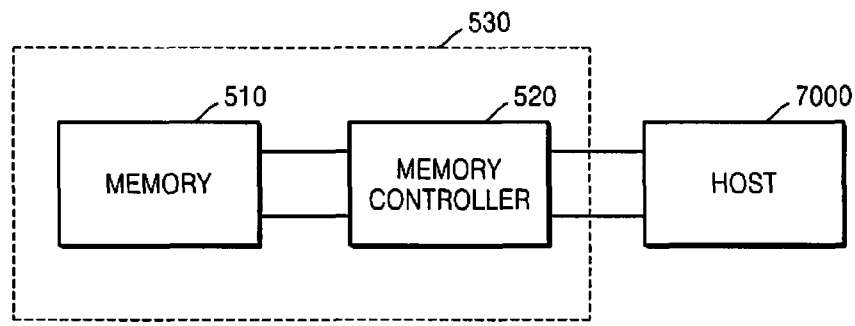
FIG. 33 illustrates an example memory card and host system in accordance with example embodiments.

FIG. 33 illustrates an example memory card and host system in accordance with example embodiments in which the host system 7000 is connected to the card 530 of FIG. 31. In example embodiments, the host system 7000 may apply control signals to the card 530 such that the memory controller 520 controls operation of the memory 510.

Figure 34:
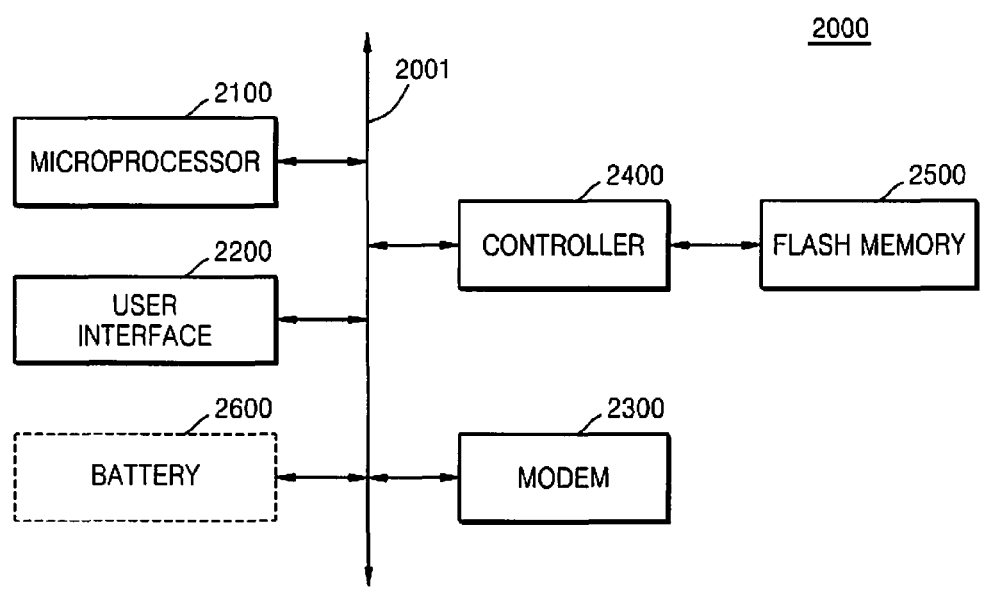
FIG. 34 illustrates an example system in accordance with example embodiments.

FIG. 34 illustrates an example system in accordance with example embodiments. As shown, system 2000 may include a microprocessor 2100, user interface 2200, for example, a keypad, a keyboard, and/or a display, modem 2300, controller 2400, memory 2500 and/or battery 2600. In example embodiments, each of the system elements may be combined each other through a bus 2001.

The controller 2400 may also include one or more microprocessors, a digital signal processor, a microcontroller, or any processor similar to the above. The memory 2500 may be used to store data and/or commands executed by the controller 2400. The memory 2500 may be any of any of the memories described in example embodiments above.

The modem 2300 may be used to transmit data to and/or from another system, for example, a communication network. The system 2000 may be part of a mobile system, such as a PDA, a portable computer, web tablet, a wireless phone, a mobile phone, a digital music player, memory card, or other system transmitting and/or receiving information.

Although many example embodiments with many features and characteristics are described above, these embodiments, features, and characteristics may be used in any combination.

Example embodiments being thus described, it will be obvious that the same may be varied in many ways. Such variations are not to be regarded as a departure from example embodiments, and all such modifications are intended to be included within the scope of append claims.

What is claimed:

1. A tape wiring substrate comprising:
   a film having an upper surface including a chip mounting area, a lower surface, and vias penetrating the film;
   an upper metal layer on the upper surface of the film and connected to electrode bumps of a semiconductor chip; and
   a lower metal layer on the lower surface of the film;
   the vias being located outside of the chip mounting area, wherein
   the lower metal layer further includes a ground layer that covers at least the chip mounting area,
   the lower metal layer further includes a power layer, and
   the ground layer surrounds at least three sides of the power layer.

2. The substrate of claim 1, wherein the ground layer is separated into a plurality of ground layers.

3. The substrate of claim 1, wherein the ground layer surrounds the chip mounting area.

4. The substrate of claim 1, wherein the power layer is separated into a plurality of power layers.

5. The substrate of claim 1, wherein a thickness of the lower metal layer is thicker than that of the upper metal layer.

6. The substrate of claim 1, wherein the power layer and the ground layer are fabricated from one of a plate and a mesh.

7. The substrate of claim 6, wherein the upper metal layer includes input terminal patterns, output terminal patterns, and dummy terminal patterns for dummy bumps of the semiconductor chip, and the dummy terminal patterns are connected to the ground layer through dummy vias.

8. The substrate of claim 7, wherein the vias are provided below one end of the input terminal patterns and the dummy vias are provided below one end of the dummy terminal patterns.

9. The substrate of claim 1, the film further including vias penetrating the film, the vias being located in the peripheral area of the chip mounting area.

10. A tape wiring substrate comprising:
    a film having an upper surface including a chip mounting area, a lower surface, and vias penetrating the film;
    an upper metal layer on the upper surface of the film and connected to electrode bumps of a semiconductor chip;
    a lower metal layer on the lower surface of the film;
    the vias being located outside of the chip mounting area; and
    at least one through-via penetrating the film,
        the at least one through via being inside of the chip mounting area, and
        the at least one through via being electrically connected to a bottom surface of the semiconductor chip;
    wherein the lower metal layer further includes a ground layer connected to the vias being located outside of the chip mounting area and one of the at least one through-via.

11. The tape wiring substrate of claim 10, wherein the vias being located outside of the chip mounting area are electrically connected to the semiconductor chip by the lower metal layer, and the lower metal layer is electrically connected to a bottom surface of the semiconductor chip.

12. A package comprising:
    a semiconductor chip having an active surface with electrode bumps;
    a tape wiring substrate on which the semiconductor chip is mounted such that the electrode bumps face the tape wiring substrate; and
    a molding compound between the semiconductor chip and the tape wiring substrate,
    the tape wiring substrate including;
        a film having an upper surface including a chip mounting area, a lower surface, and vias penetrating the film;
        an upper metal layer on the upper surface of the film and connected to electrode bumps of the semiconductor chip;
        a lower metal layer on the lower surface of the film;
        the vias being located outside of the chip mounting area; and
    at least one through-via penetrating the film,
        the at least one through via being inside of the chip mounting area, and
        the at least one through via being electrically connected to a bottom surface of the semiconductor chip;
    wherein the lower metal layer further includes a ground layer connected to the vias being located outside of the chip mounting area and one of the at least one through-via.

13. The package of claim 12, wherein the vias being located outside of the chip mounting area are electrically connected to the semiconductor chip by the lower metal layer, and the lower metal layer is electrically connected to a bottom surface of the semiconductor chip.

\* \* \* \* \*